United States Patent [19]
Jigour et al.

[11] Patent Number: 6,026,007
[45] Date of Patent: Feb. 15, 2000

[54] INSERTABLE AND REMOVABLE HIGH CAPACITY DIGITAL MEMORY APPARATUS AND METHODS OF OPERATION THEREOF

[75] Inventors: Robin J. Jigour; David K. Wong, both of San Jose, Calif.

[73] Assignees: Integrated Silicon Solution, Inc.; Nex Flash Technologies, Inc., both of Santa Clara, Calif.

[*] Notice: This patent is subject to a terminal disclaimer.

[21] Appl. No.: 09/084,044

[22] Filed: May 22, 1998

Related U.S. Application Data

[63] Continuation of application No. 08/823,937, Mar. 25, 1997, Pat. No. 5,815,426, and a continuation-in-part of application No. 08/689,687, Aug. 13, 1996, Pat. No. 5,877,975.

[51] Int. Cl.[7] .................................................. G11C 5/02
[52] U.S. Cl. ............................ 365/51; 365/52; 365/63; 365/244
[58] Field of Search ................................ 365/51, 63, 52, 365/244

[56] References Cited

U.S. PATENT DOCUMENTS

| | | |
|---|---|---|
| 4,654,829 | 3/1987 | Jiang et al. . |
| 5,164,916 | 11/1992 | Wu et al. . |
| 5,291,584 | 3/1994 | Challa et al. . |
| 5,293,236 | 3/1994 | Adachi et al. . |
| 5,296,692 | 3/1994 | Shino . |
| 5,357,621 | 10/1994 | Cox . |
| 5,394,206 | 2/1995 | Cocca . |
| 5,532,954 | 7/1996 | Bechtolsheim et al. . |
| 5,589,719 | 12/1996 | Fiset . |
| 5,605,463 | 2/1997 | MacGregor et al. . |
| 5,608,606 | 3/1997 | Blaney . |

FOREIGN PATENT DOCUMENTS

WO 96/02034  1/1996  WIPO .

OTHER PUBLICATIONS

ETSI, Draft pr ETS 300 608 Third Edition, European digital cellular telecommunications system (Phase 2); Specification of the Subscriber Identify Module—Mobile Equipment (SIM-ME) Interface (GMS 11.11), Dec., 1995.

Intel Corporation, Miniature Card Specification Release 1.0, Feb. 29, 1996.

ISO/IEC, International Standard ISO/IEC 7816-3 First Edition, Identification cards—Integrated Circuit(s) with contacts—Part 3: Electronic signals and transmission protocols, Sep. 15, 1989.

ISO, International Standard ISO 7816-2 First Edition, Identification cards—Integrated Circuit(s) with contacts—Part 2: Dimensions and location of the contacts, May 15, 1988.

ISO, International Standard ISO 7816-1 First Edition, Identification cards—Integrated Circuit(s) with contacts—Part 1: Physical characteristics, Jul. 1, 1987.

ITT Cannon, CCM Smart Card Connectors, 1996.

Nexcom Technology, Inc., NX26F080 Data Sheet, Mar. 1996.

Nikkei Electronic Asia; Three Stamp-Sized Flash Cards Appear in Electronic Cameras; Special Report; pp. 62–67, Jul. 1996.

PCMCIA/JEIDA, PC Card Standard, Physical Specification, Feb. 1995.

Portable Design; Memories are Made of This; article; Jul. 1996; pp. 23–24.

SunDisk Corporation, Compact Flash Series, Rev. 1.0, Oct. 1994.

Toshiba America Electronic Components, Inc., Solid–State Floppy Disk Card (SSFDC) TC5816ADC 1996 Data Sheet (preliminary) NV 16030496; 16Mbit (2M×8 BIT) CMOS NAND EEPROM; Apr. 1996; specification; page 1.

Toshiba America Electronic Components, Inc., TC5816ADC Data Sheet, 1996.

Xicor, Inc., Data Book, Jul. 1995.

*Primary Examiner*—David Nelms
*Assistant Examiner*—Hoai V. Ho
*Attorney, Agent, or Firm*—David H. Carroll

[57] ABSTRACT

Each device of a family of removable digital media devices (310, 320, 330, 340, 350 and 360) may be plugged into a host to permits the host to store data in it or to retrieve data from it. The form factors of the digital media devices in the family and the connector system used by the digital media devices are compact for minimizing the volume of space occupied in portable devices and for easy storage. Some embodiments (310, 320, 330, 350 and 360) provide an elongated compact form factor that provides easy and firm grasping for insertion and removal. The digital media devices of the family have respective body portions (312, 322, 332, 342, 352 and 362) preferably of a rigid or semi-rigid material. Preferably, the digital media devices of the family use serial memory requiring few power and signal lines, so that few electrical contacts are required. In particular, a small number of durable contact pads form the contact arrays (314, 324, 334, 344, 354 and 364) on the digital media devices, which in conjunction with corresponding contact pads mounted into a suitable socket provide for easy and convenient insertion and removal and for robust and reliable electrical contact over a long insertion lifetime. Preferably, the digital media devices of the family incorporate flash memory, which permits low voltage operation, low power consumption, and high capacity non-volatile data storage. Preferably, the digital media devices of the family are fabricated using surface mount techniques (310 and 320) or particularly inexpensive "Chip on Board" techniques (330, 340, 350 and 360). The digital media devices interface to the host either directly or through adapters. Access is handled either by a dedicated controller or other logic residing in the adapter or on the host, or by software running on the host.

37 Claims, 12 Drawing Sheets

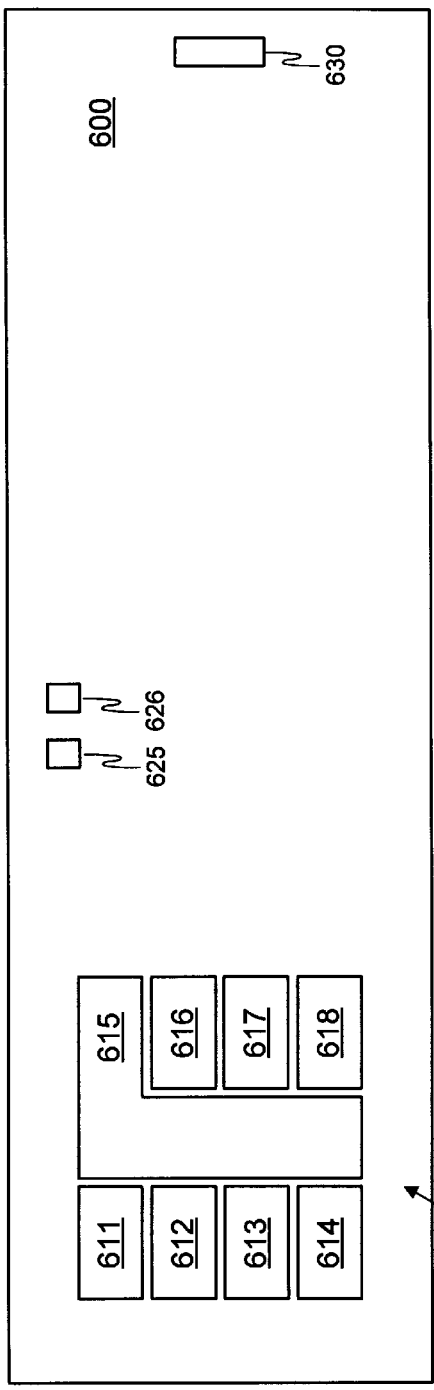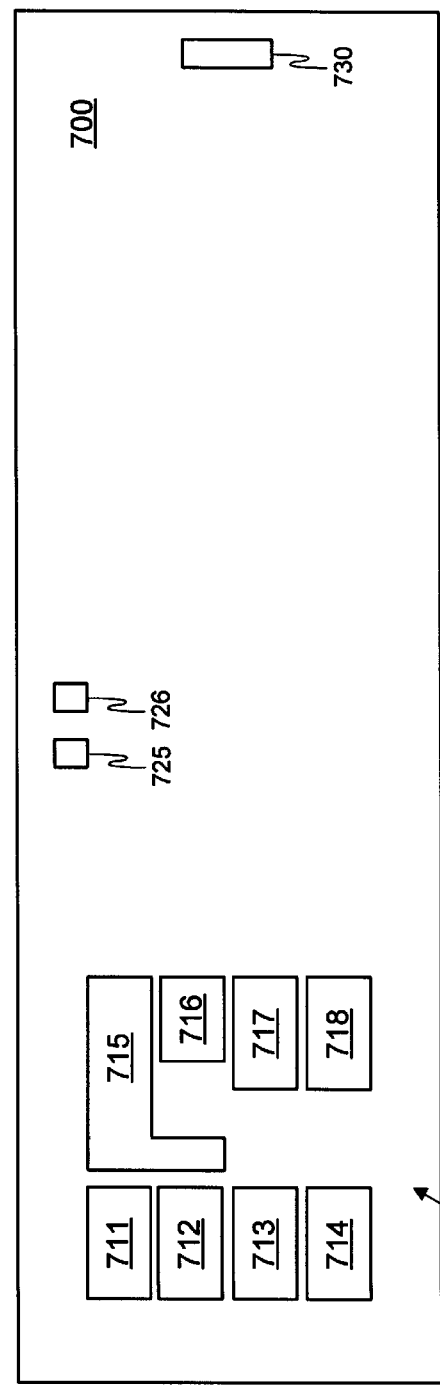

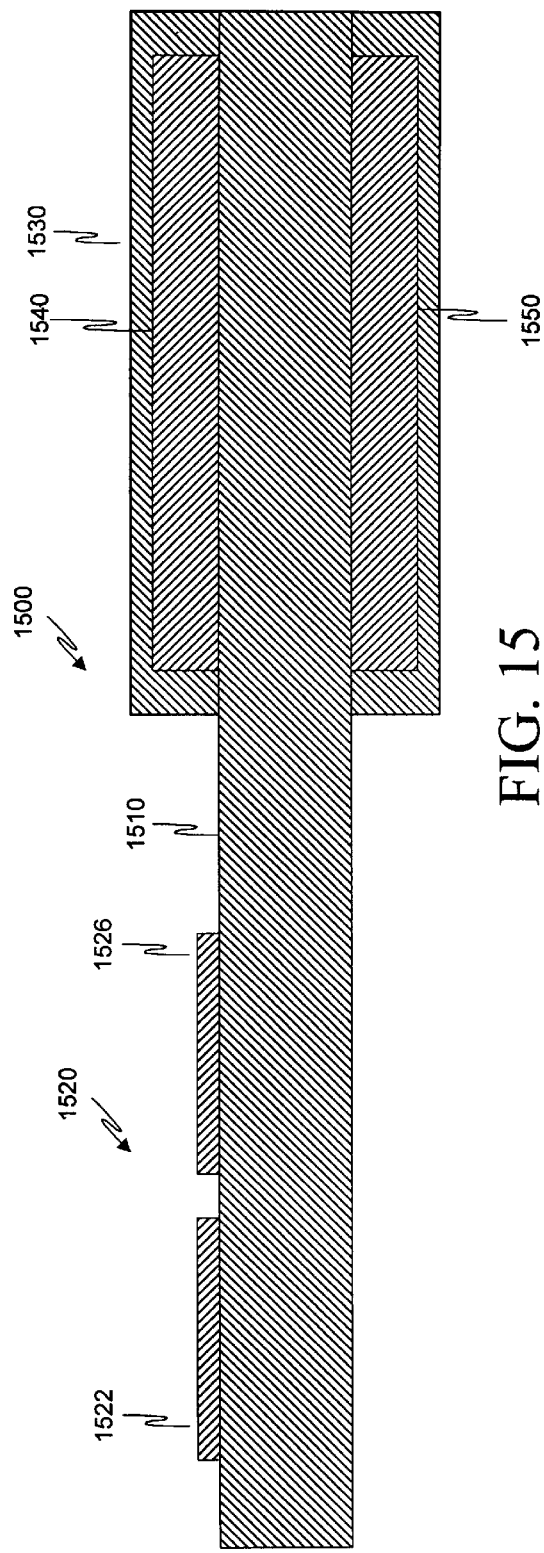
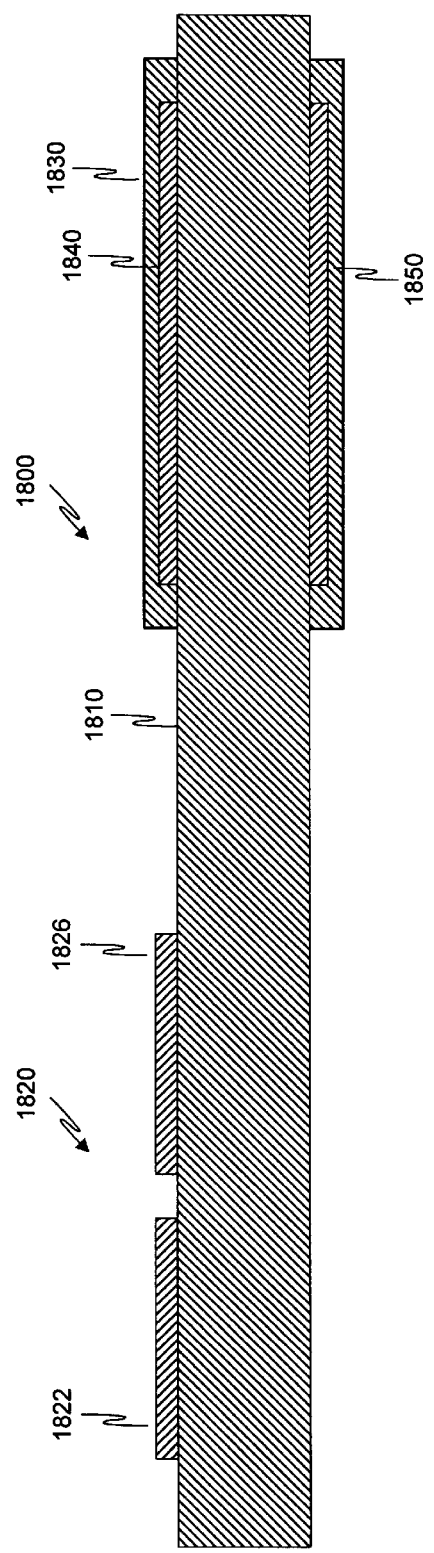
FIG. 15
FIG. 18

INSERTABLE AND REMOVABLE HIGH CAPACITY DIGITAL MEMORY APPARATUS AND METHODS OF OPERATION THEREOF

RELATED APPLICATIONS

This application is a continuation of U.S. patent application Ser. No. 08/823,937, filed Mar. 25, 1997 U.S. Pat. No. 5,815,426, which names Jigour and Wong as coinventors and is entitled "Adapter for Interfacing an Insertable/Removable Digital Memory Apparatus to a Host Data Port," which is a continuation-in-part of U.S. patent application Ser. No. 08/689,687, filed Aug. 13, 1996 U.S. Pat. No. 5,877,975 which names Jigour and Wong as coinventors and is entitled "Insertable/Removable Digital Memory Apparatus and Method of Operation Thereof," both of which are hereby incorporated herein in their entirety by reference thereto.

BACKGROUND OF THE INVENTION

1. Field of the Invention

The present invention relates to digital media, and more particularly to digital media such as cards and modules, sockets therefor, control thereof, and combinations thereof.

2. Description of Related Art

A variety of add-on cards and modules for use in digital systems such as personal computers ("PC") have enjoyed a measure of success in various memory-intensive applications. Some of these memory add-on cards use flash memory, and are known as flash PC cards. Flash PC cards have become widely used for mass data storage applications, and are a popular alternative for conventional add-on card implemented non-volatile memory solutions such as rotating hard disks and battery-backed SRAM, especially for notebook computers, personal data assistants ("PDAs"), and some high-end digital cameras. As an alternative to rotating hard disk PC cards, flash PC cards are more rugged and space efficient, are silent, consume less power, provide higher performance (in most cases), and provide a removable form-factor. As an alternative to battery-backed SRAM PC cards, flash PC cards typically offer higher-densities and lower cost per bit and are not as limited by reliability and temperature issues associated with batteries used in the battery-backed SRAM PC cards.

FIG. 1 shows to scale the surface area of a number of high capacity memory card types presently available. The surface area of a flash PC card is shown at 100 in FIG. 1. Flash PC cards are compliant with the Personal Computer Memory Card International Association ("PCMCIA") standard, which specifies a form factor of approximately 85.6 mm (3.37 inches) by 54 mm (2.126 inches), with a thickness of either about 3 mm for a Type-I card or about 5 mm for a Type-II card. The connector specified by the PCMCIA standard uses 68 pins organized in two rows of 34 pins each with 1.27 mm (50 mils) spacing between pins. The physical specifications for PC cards are described in a publication of the Personal Computer Memory Card International Association/JEIDA entitled PC Card Standard, Volume 3: Physical Specification, Document No. 0295-03-1500, February 1995.

Flash PC cards typically have a high memory capacity of from about 2 Megabytes to 85 Megabytes, although recently even higher capacity cards have been introduced. Like hard-disks, flash PC cards spend about 75 percent of operation time being read from and 25 percent being written to. The two primary PC card interface types are ATA and Linear. PC cards that support the ATA interface use an on-card ATA controller, which allows "plug and play" compatibility between portable computers and PDAs. Linear flash cards do not use a dedicated ATA controller and require software drivers to implement file interface protocol.

While flash PC cards can provide sufficient amounts of memory for a broad range of applications, they have not been widely accepted for use in applications such as mobile and portable electronics or for use in applications having significant cost sensitivity. PC cards simply tend to be too large for many portable applications such as pagers, voice recorders, mobile telephones, and hand-held meters. PC cards are also too bulky and heavy for carrying in a pocket or wallet, as would be desirable for many consumer applications. Current PC cards are also quite expensive, hence are offered generally as after market enhancements or add-ons. PC cards can be made available at extremely high memory capacities because of improved memory technology, however, such extremely high memory capacities are in excess of what is optimal for many mobile and portable applications. Moreover, although the insertion lifetime of 68-pin PC card connectors, which is about 10,000 cycles, is generally adequate for portable computers and PDAs, it is inadequate for other applications involving more frequent insertion and removal of the storage media than encountered in portable computing. In addition, the high number of pins and the tendency of the narrow deep sockets on the PC cards to collect foreign material increase the probability of failure, especially if the PC cards are not carefully handled. Also, PC cards have parallel busses, which are problematical since they permit multiple signal transitions that cause system noise and interference with wireless RF products. Some PC cards commonly available use channel hot electron flash technology, which because of its inherent high current demands tends to make erase/write programming times lengthy and reduce effective battery lifetimes in mobile and portable applications.

As the PCMCIA standard is not entirely suitable for small portable devices, flash memory recently has been used in a variety of removable devices having smaller form factors than the standard PC card, including, for example, compact flash cards, miniature cards, and solid state floppy disk cards ("SSFDC"). The surface areas of these devices are illustrated at 110, 120 and 130 respectively in FIG. 1.

The compact flash card is a small format flash memory card that was initially announced by SanDisk Corporation in 1994. The form factor of the compact flash card is 36×43×3.3 mm, and the surface area thereof, which is shown at 110 in FIG. 1, is approximately ⅓ the surface area of the standard PC Card. The card has a 50 pin connector that is a subset of the PC card interface. The card supports the IDE/ATA interface standard by means of an on-card ATA controller IC. Memory capacity in the range of 2 Megabytes to 15 Megabytes is currently available, although greater memory capacity devices are likely to be introduced. Both 5 volt and 3.3 volt power supplies are supported. A compact flash card is interfaced to notebook computers and PDAs by inserting the card into a special PC card adapter. The compact flash series is described in a publication of the SanDisk Corporation entitled Compact flash Series Preliminary Data Sheet, Document No. 80-11-00015, Rev. 1.0, October 1994.

The miniature card is a small format card that was initially announced by Intel Corporation in 1995. The form factor of the miniature card is 35×33×3.5 mm, and the surface area, which is shown at 120 in FIG. 1, is approximately 25% the surface area of the standard PC card. The miniature card has a 60 pin Elastimeric connector rated at a minimum insertion lifetime of 5,000 cycles. The card supports a linear addressing range of up to 64 Megabytes of memory using a 16-bit data bus. Memory capacity in the range of 2 Megabytes to 4 Megabytes is currently available, although greater memory capacity devices are likely to be introduced. The miniature card specification allows for flash, DRAM and ROM memory types. Both 5 volt and 3.3 volt power supplies are supported by the specification. A miniature card is interfaced to notebook computers and PDAs that support the standard PC card interface with a special PC card adapter. A miniature card specification is described in Miniature Card Specification, Release 1.0, February 1996, available from Intel Corporation of Santa Clara, Calif.

The solid state floppy disk card, or SSFDC, is a small format card initially announced by Toshiba Corporation in 1995. The form factor of the SSFDC card is 45×37×0.76 mm, and the surface area thereof, which is shown at 120 in FIG. 1, is approximately 36% the surface area of the standard PC card. The SSFDC has 22 flat contact pads, some of which are I/O pads for both address and data input and output as well as for command inputs. The card specification is dedicated to byte serial NAND-type flash memory. Memory capacity of 2 Megabytes is currently available, although memory capacity in the range of 512 kilobytes to 8 Megabytes is anticipated. The specification accommodates 5 volt or 3.3 volt power supplies. An SSFDC is interfaced to notebook computers and PDAs that have the standard PC card interface with a special PC card adapter. An illustrative device is type TC5816ADC, which is described in Preliminary TC5816ADC Data Sheet No. NV16030496, April 1996, available from Toshiba America Electronic Components, Inc. of Irvine, Calif. The device is said to be suitable for such applications as solid state file storage, voice recording, image file memory for still cameras, and other systems which require high capacity, non-volatile memory data storage.

Seimens Components of Cupertino, Calif. has described a device known as MultiMediaCards, or MMC; see Portable Design, July 1996, p. 23 et seq. The form factor of the MMC package is 37×45×1.4 mm, and the surface area, which is shown at 140 in FIG. 1, is approximately 36% that of the standard PC card. The MMC package has 6 edge-mounted contact pads with an insertion lifetime of 10,000 cycles, and uses a serial bus. Initially, MMCs are expected to be offered with a choice of 16 Megabit or 64 Megabit ROM memory, but is reported to be teaming up with undisclosed partners to put flash memory on its MMC cards. The specification accommodates a 3.3 volt power supply. The device is said to be suitable for such applications as video games, talking toys, automobile diagnostics, smart phones (tailored operating systems or special programs), PDAs (tailored operating systems or special programs), and notebooks through a PDA adapter.

Some low memory capacity card formats have enjoyed a measure of success in certain specific applications. FIG. 2 shows form factors 210 and 220 of two commercially successful low memory bandwidth card formats known as the IC card format and the SIM card format, respectively. The form factors 210 and 220 are to scale with the form factors 100, 110, 120 and 130 of FIG. 1.

The Integrated Circuit (IC) card format and the similar Identification (ID) card format, commonly known as smart cards, were introduced in the mid 1980's, and have been standardized by the International Organization for Standardization (ISO); see International Organization for Standardization, Identification Cards—Integrated Circuit Cards with Contacts, Part 1: Physical Characteristics, Document No. ISO 7816-1, July 1987; International Organization for Standardization, Identification Cards—Integrated Circuit Cards with Contacts, Part 2: Dimensions and Location of Contacts, Document No. ISO 7816-2, May 1988; and International Organization for Standardization, Identification Cards—Integrated Circuit Cards with Contacts, Part 3: Electronic Signals and Transmission Protocols, Document No. ISO 7816-3, September 1989. Smart cards are credit card sized and typically contain a microcontroller with a small amount of EEPROM memory, typically 256 to 8K bits. The surface area of the smart card is shown at 210 in FIG. 2. The length and width of the smart card is nearly identical with the length and width of the PC card, but the smart card is much thinner. The cards are popular in Europe and are making inroads into the US market. Primary applications are smart telephone calling cards and stored value cards, the later application being promoted by credit card companies like Visa and Master card as a replacement for paper currency. IC and ID cards have a simple contact pattern of eight flat contact pads designated C1–C8 of which only six are used. Contact signal assignments are C1=$V_{CC}$ (supply voltage), C2=RST (reset), C3=CLK (clock signal), C4=Reserved, C5=GND (ground), C6=$V_{pp}$ (programming voltage), C7=I/O (data input/output) and C8=Reserved. Due to their popularity in Europe, a great infrastructure of connectors and readers is already established for IC and ID cards.

Another low memory capacity card format is known as the Subscriber Identification Module ("SIM"), which is used in conjunction with mobile telephones based on the Global System for Mobile Communications ("GSM") standard. The SIM specification is set forth in a publication of the European Telecommunication Standard Institute entitled European Digital Cellular Telecommunication System, Global System for Mobile Communications, Phase 2: Specification of Subscriber Identity Module—Mobile Equipment Interface, Document No. GSM11.11, Reference (RE/SMG)-09111PR3, ICS 33.060.50, December 1995. The form factor of the SIM is 25 mm×15 mm×0.76 mm, and the surface area thereof, which is shown at 220 in FIG. 2, is much smaller than the standard PC card. SIMs offer only a very limited amount of memory, typically less than one kilobit. However, this small amount of memory is sufficient to provide a GSM mobile phone with secure identification of the GSM subscriber, and may also hold a small amount of data for call metering, phone number storage, and in some cases very short data messages (less than a few hundred bytes of data). The SIM uses the same 8 pad contact pattern as the IC card, but only five of the pads are required for $V_{CC}$, RST, CLK, GND, and I/O. The plug-in SIM typically is housed in a small hinged smart card connector similar to the type CCM03 available from ITT Cannon Corporation of Santa Ana, Calif. The small form factor allows the GSM SIM to be placed inside the phone as a plug-in module. Because the GSM SIM typically is removed only if a different GSM phone is to be used, GSM SIM connectors typically are designed for fewer insertion/removal cycles than normally experienced with IC and ID cards.

Other memory technologies have not been widely used in insertable/removable memory modules and cards because of their inherent shortcomings relative to such successful technologies as flash. For example, battery-backed SRAM or DRAM memories require supplemental battery power when the main power is removed, while flash memory is non-volatile (no battery is needed) and is more reliable over temperature. Flash memory is available in higher densities and at lower cost/bit than SRAM and EEPROM memory, and is cost-competitive with DRAM memory.

Despite advances in the art, a need still exists for a memory card or module that can store and be used to transfer large amounts of digital information such as commonly encountered in audio, data and image applications, yet be inexpensive to manufacture, compatible with existing standards, easy to store, convenient to insert and remove from its host, rugged and durable enough to withstand numerous insertion/removal cycles, and require minimal hardware interface overhead.

SUMMARY OF THE INVENTION

The various embodiments of the present invention have many advantages. The memory capacity of some of the embodiments is ideally suited to the storage and transfer large amounts of digital information such as commonly encountered in audio, data and image applications and the small yet convenient form factors make them ideally suited to personal, mobile and portable electronics equipment. Some of the embodiments of the present invention are rugged and durable enough to withstand numerous insertion/removal cycles. Some of the embodiments of the present invention are compatible with existing standards, some are inexpensive to interface to, and some are particularly inexpensive to manufacture.

One embodiment of the present invention, a storage apparatus, comprises a body, an array of electrical contact pads disposed generally level with a first major surface of the body, a data line, a power line, a ground line, a clock line, and a high capacity memory integrated circuit. The memory integrated circuit is coupled to the electrical contact pad array by the data line, the power line, the ground line, and the clock line. In one variation, the data line is serial and is coupled to a serial port of the memory integrated circuit. In another variation, the body is generally rectangular and elongated, and the array of electrical contact pads extends substantially across a major surface of the body near an end thereof.

Another embodiment of the invention, an insertable and removable non-volatile digital data storage apparatus for use in electronic apparatus having digital data storage requirements, comprises a body generally of a form convenient for handling by a human hand and for insertion to and removal from the digital apparatus, a high capacity digital memory having serial data transfer, clock, power, and ground connectivity requirements; and a plurality of electrical contacts integral with the body and satisfying the serial data transfer, clock, power, and ground connectivity requirements of the memory. In one variation, the memory comprises a high capacity digital memory integrated circuit. In another variation, the memory comprises first and second high density digital memory integrated circuits.

Yet another embodiment of the invention, a method for transferring data between a digital apparatus having data storage requirements and a high-capacity digital data storage card, comprises inserting the card into the digital apparatus in a predetermined direction, applying power to the card through a first contact thereof, applying ground to the card through a second contact thereof, applying a clock signal to the card through a third contact thereof, and serially transferring a large digital file between the digital apparatus and the card through a fourth contact thereof. One variation further comprises determining a write-protect condition through a contact. Another variation further comprises applying a chip select signal through a contact.

BRIEF DESCRIPTION OF THE DRAWINGS

In the drawings, in which like reference characters indicate like parts:

FIGS. 5, 6 and 7 are schematic views of contact pad arrays in accordance with the present invention;

FIG. 15 is a cross-sectional view of a surface mount digital media device having two surface-mounted packaged integrated circuits;

FIG. 18 is a cross-sectional view of a chip-on-board-direct digital media device having two chips;

DETAILED DESCRIPTION OF THE PREFERRED EMBODIMENT

Digital media means insertable/removable memory media for storing and transferring large digital files, especially audio, data and image files in personal, portable, industrial and mobile environments. Digital media storage typically involves a higher percentage of erase/write accesses than code storage and ordinary data and mass storage, typically about 50 percent read and 50 percent erase/write ratio. The storage requirement typically is high capacity, i.e. about one Megabit or greater. For example, a one Megabit flash device might store 1–2 minutes of digital voice recording, a 10 page fax, or 10–20 medium resolution compressed digital camera pictures. Preferably, digital media supports read, erase, and write at either 5 volt or 3 volt supply levels, and contains small sectors that can be programmed quickly to efficiently use battery-power and to keep pace with high-speed portable and mobile applications. Examples of media elements stored or transferred include voice and sound clips, facsimile, pictures, writing, drawing, scanned images, maps, e-mail, data logging, downloadable code, and general data files. A few examples of emerging digital media storage applications include digital cameras, solid-state voice recorders, portable scanners and bar-code readers, voice/data pagers, cellular phone answering machines, portable pen-based tablets, hand-held terminals and meters, and portable data acquisition equipment.

Figure 3:
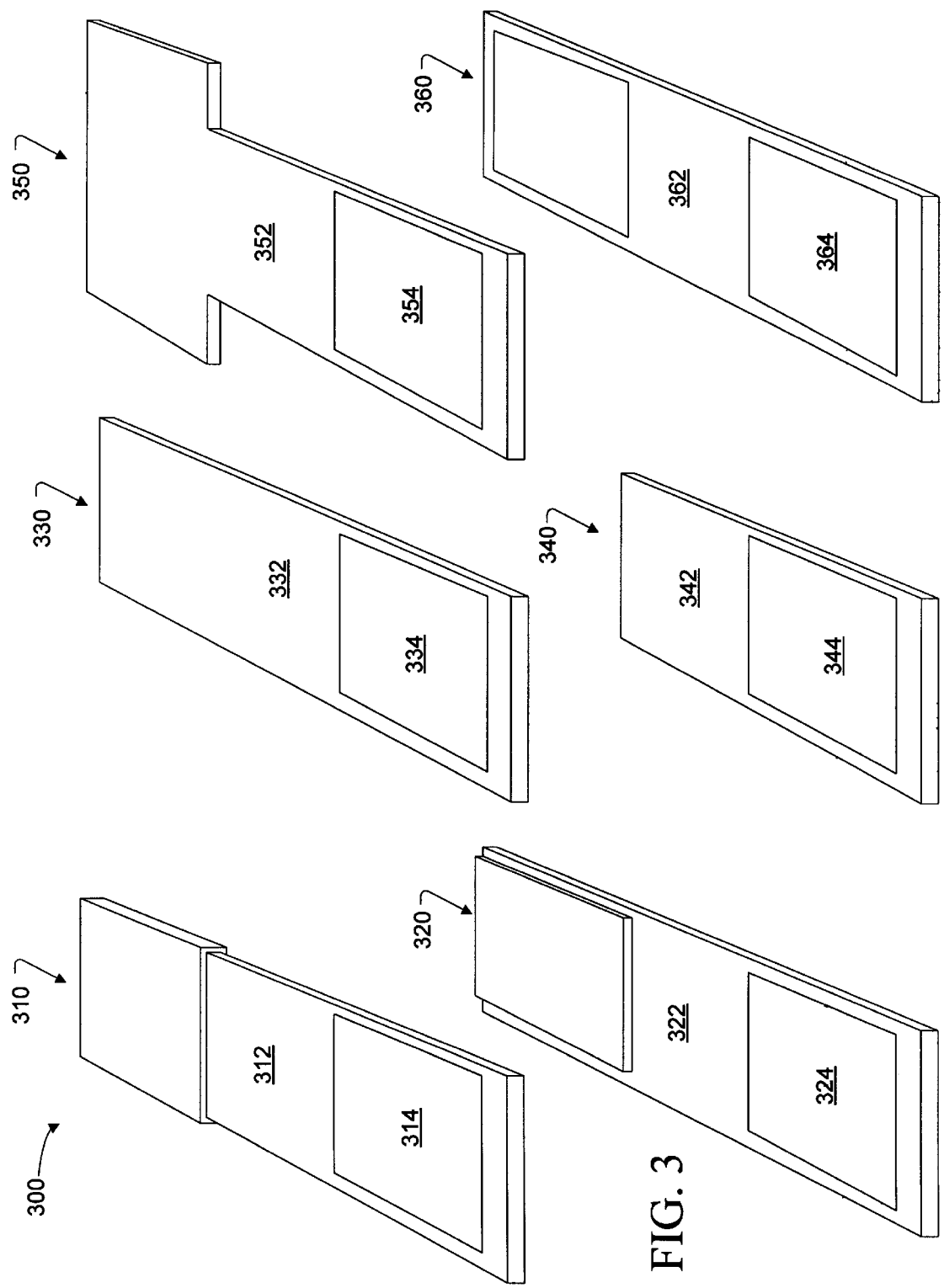
FIG. 3 is a perspective view of a family of digital media devices in accordance with the present invention.

FIG. 3 is a perspective view of a family 300 of removable digital media devices 310, 320, 330, 340, 350 and 360, each of which when plugged into a host permits the host to store data in it or to retrieve data from it. Preferably, the form factors of the digital media devices in the family 300 and the connector system used by the digital media devices are compact for minimizing the volume of space occupied in portable devices and for easy storage. Some embodiments, illustratively digital media devices 310, 320, 330, 350 and 360 provide an elongated compact form factor that provides easy and firm grasping for insertion and removal. The digital media devices of the family 300 have respective body portions 312, 322, 332, 342, 352 and 362 preferably of a rigid or semi-rigid material such as mylar, poly-vinyl chloride ("PVC") or PVCA material, which is commonly used in smart cards and modules, or FR4 epoxy glass, which is commonly used for printed circuit boards. Preferably, the digital media devices of the family 300 use serial memory requiring few power and signal lines, so that few electrical contacts are required. In particular, a small number of durable contact pads form respective contact arrays 314, 324, 334, 344, 354 and 364 on the digital media devices 310, 320, 330, 340, 350 and 360, which in conjunction with corresponding contact pads mounted into a suitable socket provide for easy and convenient insertion and removal and for robust and reliable electrical contact over a long insertion lifetime. Preferably, the digital media devices of the family 300 incorporate flash memory, which permits low voltage operation, low power consumption, and high capacity non-volatile data storage. Preferably, the digital media devices of the family 300 are fabricated using surface mount techniques, of which the digital media devices 310 and 320 are illustrative, or particularly inexpensive "Chip on Board" ("COB") techniques, of which the digital media devices 330, 340, 350 and 360 are illustrative.

Preferably, the form factors of the digital media devices in the family 300 are compact for easy storage and transportation and for minimizing "insertion volume" in a host such as a laptop computer or PDA. Insertion volume is the volume required to house a card or module, or rather the connector of the card or module and as much of the card or module as is required to be contained by the host. Some family members provide an elongated compact form factor that provides easy and firm grasping for insertion and removal, as well as space for additional memory ICs or chips. Other family members are of a length comparable with the length of certain common battery types such as AA and AAA batteries, and are therefor capable of insertion into the battery compartments of personal, portable and mobile equipment.

Although generally shown as having a rectangular shape, the digital media devices of the family 300 may be made in other shapes. For example, the digital media device 350 has a key-like shape which provides not only convenient handling but also more surface area for additional memory circuits and for the manufacturer's logo, use instructions, user written notes, and the like. The corners of the digital media devices of the family 300 may be rounded if desired.

Figure 1:
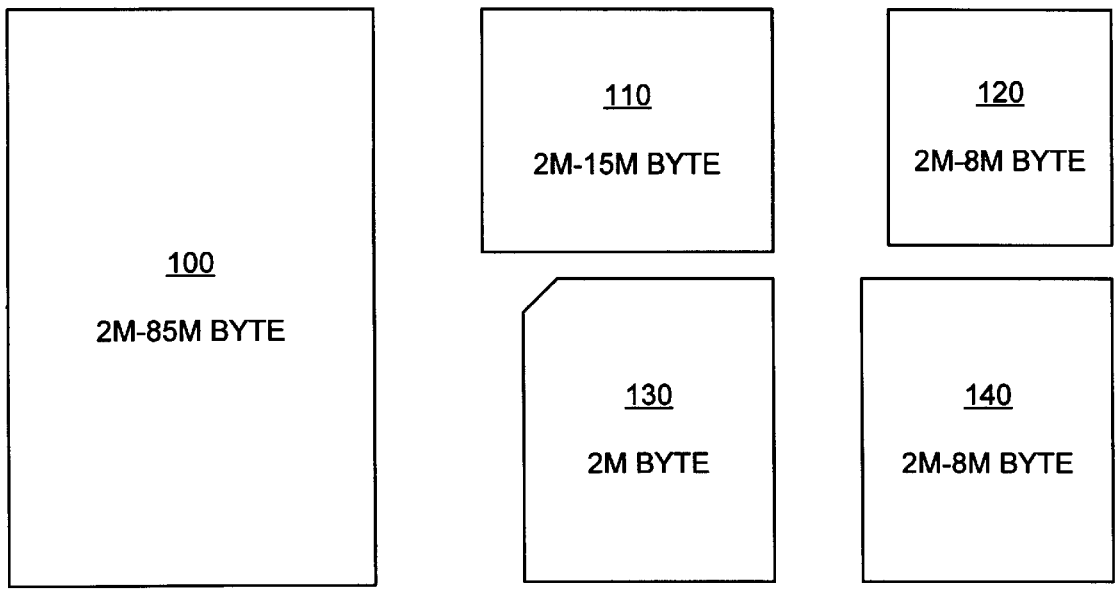
FIG. 1 is a schematic view of the surface area profile of a variety of high capacity prior art add-on cards.
Figure 2:
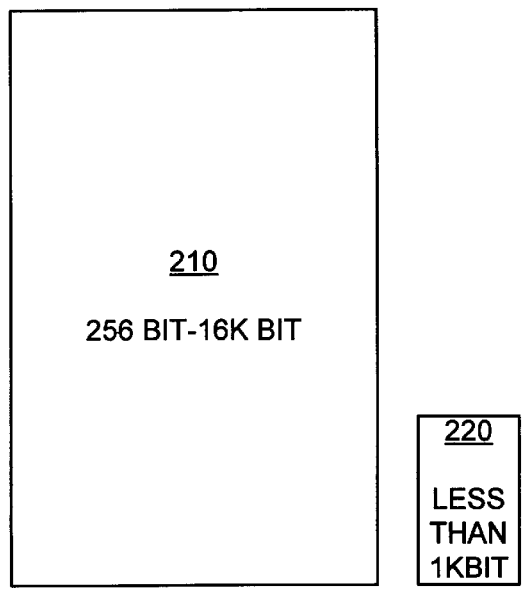
FIG. 2 is a schematic view of prior art smart card and SIM module surface area profiles.
Figure 4:
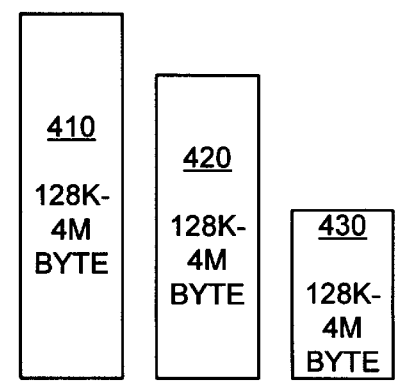
FIG. 4 is a schematic view of the surface area profiles of various digital media devices in accordance with the present invention.

FIG. 4 shows illustrative surface area profiles 410, 420 and 430 of various digital media devices, which are at the same scale as the various surface area profiles shown in FIGS. 1 and 2. As will be appreciated by comparing the surface area profiles 410, 420 and 430 with the various surface are profiles for flash memory devices shown in FIG. 1, the digital media devices having the surface area profiles 410, 420 and 430 have numerous advantages, even while providing memory capacity that is comparable with most other high capacity cards and comparable even with PC cards at the low end of their typical capacity range, yet ideally suited to digital media storage applications. For example, the surface area profile 420 is only about 15% the surface area profile 100 of the PCMCIA form factor and has a relatively small insertion volume requirement, and even the profile 410 is only about 18% the surface area profile 100 of the PCMCIA form factor and also has a relatively small insertion volume requirement. Compare the surface area profiles 410 and 420 with, for example, the surface area profile 110 of the compact flash form factor, the surface area profile 120 of the miniature card form factor, and the surface area profile 130 of the SSFDC form factor. The compact flash surface area profile 110 is about 33% the surface area profile 100 of the PCMCIA form factor and has a relatively large insertion volume requirement. The miniature card surface area profile 120 is about 25% the surface area profile 100 of the PCMCIA form factor and has a relatively moderate insertion volume requirement. The SSFDC surface area profile 130 is about 36% the surface area profile 100 of the PCMCIA form factor and has a relative large insertion volume requirement.

The long form factor 420 shown in FIG. 4 has a width of 15 mm, a length of 45 mm, and a thickness of 0.76 mm. Long form factor 410, which is compatible with smart card manufacturing techniques because its length is the same as the width of a smart card, has a width of 15 mm, a length of 54 mm, and a thickness of 0.76 mm. The short form factor 430 shown in FIG. 4 has a width of 15 mm, a length of 25 mm, and a thickness of 0.76 mm. The long and short form factor dimensions are illustrative, and the optimal size of the form factors suitable for the digital media device family 300 is influenced by several factors, including, for example, the size of the host, the size of the electrical contact array required, the need for sufficient body surface and a suitable shape for a user to grasp the device for insertion, removal, and transport, convenience of transport and storage, and compatibility for insertion into compartments such as battery compartments commonly provided in personal, portable and mobile equipment. The choice of form factor within the range of acceptable form factors is also influenced by other factors, including, for example, whether sufficient surface on the body is required for a user to grasp the digital media device for insertion and removal without touching the electrical contact array, which tends to favor a longer form factor, and whether the digital media device is intended for cost-sensitive applications, in which case the availability of low cost high volume manufacturing techniques is important. An example of the latter is a digital media device having a length equal to the width of a standard ISO smart IC card, which permits manufacturing equipment suitable for standard ISO smart cards to be used in the manufacture of the digital media device. The thickness of the digital media devices in the family 300 preferably achieves sufficient rigidity to permit good control over insertion and removal, and to prevent damage to the integrated circuit due to device stress under normal use. The rigidity requirements may be relaxed where the die is small or is otherwise protected, as where the die is mounted using COB packaging techniques in which the die is mounted on a rigid substrate and encased with epoxy material. Illustratively, where the media device is made from PVC, PVCA, or FR4 epoxy glass, a convenient thickness is about 0.8 mm.

A small number of durable contact pads form respective contact arrays 314, 324, 334, 344, 354 and 364 on the digital media devices 310, 320, 330, 340, 350 and 360, which in conjunction with corresponding contact pads mounted into a suitable socket provide for easy and convenient insertion and removal and for robust and reliable electrical contact. Contact pads are preferred to pins and sockets, since they are more durable and do not clog. The contact pads both in the digital media device and in its corresponding socket are flat or generally flat and lie in a generally planar major surface of the digital media device.

The number of contact pads in the array preferable is kept low, thereby permitting both a small form factor with the advantages mentioned above, as well as large contact pads to ensure durability and reliable electrical contact over many insertion-removal cycles. Contact pads disposed on a flat surface are preferred to edge pads since surface mounted pads do not trap dirt, lint, and other foreign objects, and effectively and reliably self-clean upon both insertion and removal. Surface mounted pads are more robust that the pin and socket connectors specified for PCMCIA cards, which have the further disadvantage of readily trapping dirt, lint, and other foreign objects.

Preferably, the electrical contacts of the digital media devices in the family 300 conform to the physical form of the aforementioned eight pin ISO IC card standard commonly used for smart cards and GSM SIMs, although more or fewer electrical contacts may be used if desired, consistent with the desired interface scheme, memory capacity, form factor, and insertion lifetime. Connectors that physically conform to the ISO IC card standard are advantageous in that they are readily available and simple and inexpensive to manufacture. The insertion lifetime of such contact pads is approximately 30,000 insertion/removal cycles or greater, which is a function of the thickness and composition of the contact pad material.

Figure 5:
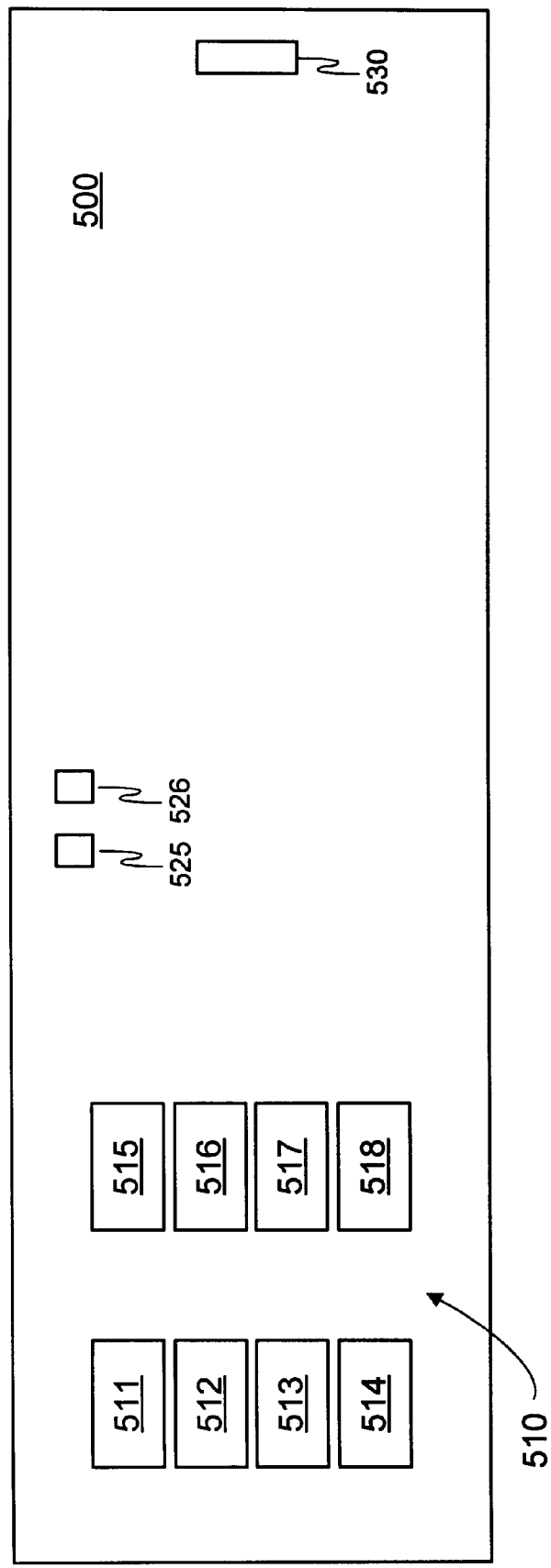

Digital media devices based on the ISO IC card standard are shown in FIGS. 5, 6 and 7. Illustratively, the digital media device 500 of FIG. 5 is 15 mm wide and 45 mm long. The contact pad array 510 is set back from the head of the digital media device 500 by 3.0 mm, and from the side of the digital media device 500 by 2.5 mm. Each of the contact pads 511, 512, 513, 514, 515, 516, 517 and 518 is 2.25 mm by 4.0 mm in size. Typically, gaps between adjacent contact pads 511 and 512, 512 and 513, 513 and 514, 515 and 516, 516 and 517, and 517 and 518 are about 0.33 mm, while pads 511 and 515, 512 and 516, 513 and 517, and 514 and 518 are about 3.5 mm. The contact pads 511–518 are made of any suitable contact pad material, such material being well known in the art. Pads 525 and 526, which are made of any suitable contact pad material, are write protect pads. While shown near the center of one edge of the digital media device 500, they may be located in any convenient place such as, for example, near one of the corners at the tail of the digital media device 500. A hole 530 is provided in the tail of the digital media device 500 to facilitate removal thereof from a socket.

Illustratively, the digital media device 600 of FIG. 6 is 15 mm wide and 45 mm long. The contact pad array 610 is set back from the head of the digital media device 600 by 3.0 mm, and from the side of the digital media device 600 by 2.5 mm. Each of the contact pads 611, 612, 613, 614, 616, 617 and 618 is 2.25 mm by 4.0 mm in size. The contact pad 615 has a portion that is 2.25 mm by 4.0 mm in size, but also has a first extension portion that extends about 3.5 mm toward contact pad 611, and a second extension portion that is just less than 3.5 mm wide and lies between pads 612 and 616, pads 613 and 617, and pads 614 and 618, which are spaced 3.5 mm from one another. Typically, gaps between adjacent portions of the contact pads 611–618 are about 0.33 mm. The contact pads 611–618 are made of any suitable contact pad material, such material being well known in the art. Pads 625 and 626, which are made of any suitable contact pad material, are write protect pads. While shown near the center of one edge of the digital media device 600, they may be located in any convenient place such as, for example, near one of the corners at the tail of the digital media device 600. A hole 630 is provided in the tail of the digital media device 600 to facilitate removal thereof from a socket.

Illustratively, the digital media device 700 of FIG. 7 is 15 mm wide and 45 mm long. The contact pad array 710 is set back from the head of the digital media device 700 by 3.0 mm, and from the sides of the digital media device 700 by 2.5 mm. Each of the contact pads 711, 712, 713, 714, 717 and 718 is 2.25 mm by 4.0 mm in size. The contact pad 715 also has a portion that is 2.25 mm by 4.0 mm in size, but has a first extension portion that extends about 3.5 mm toward contact pad 711, and a second extension portion that is 1.75 mm wide and lies between pads 712 and 716. Pads 713 and 717 and pads 714 and 718 are spaced 3.5 mm from one another, and pads 712 and 716 are spaced 4.5 mm from one another. Typically, gaps between adjacent portions of the contact pads 711–718 are about 0.33 mm wide, although the edge of the pad 716 toward the head of the digital media device 700 is spaced 2.75 mm from the second extension portion of the pad 715. The contact pads 711–718 are made of any suitable contact pad material, such material being well known in the art. Pads 725 and 726, which are made of any suitable contact pad material, are write protect pads. While shown near the center of one edge of the digital media device 700, they may be located in any convenient place such as, for example, near one of the corners at the tail of the digital media device 700. A hole 730 is provided in the tail of the digital media device 700 to facilitate removal thereof from a socket.

Figure 8:
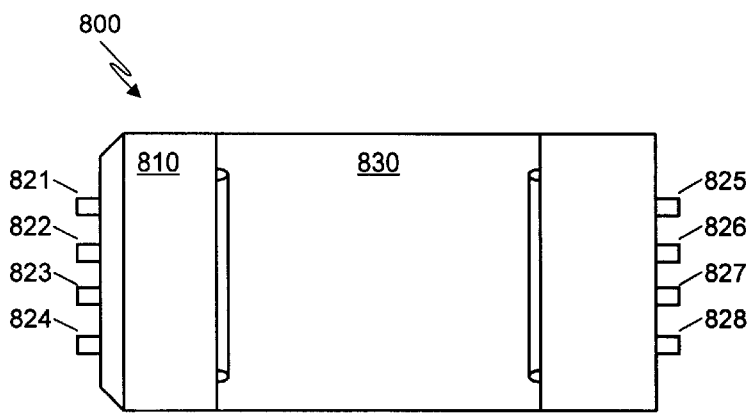
FIG. 8 is a top plan view of a socket for receiving digital media devices of the FIG. 3 family.
Figure 9:
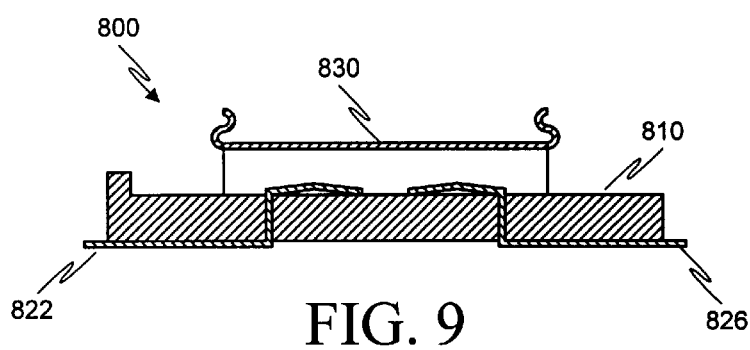
FIG. 9 is a cross-sectional view of the socket of FIG. 8.
Figure 10:
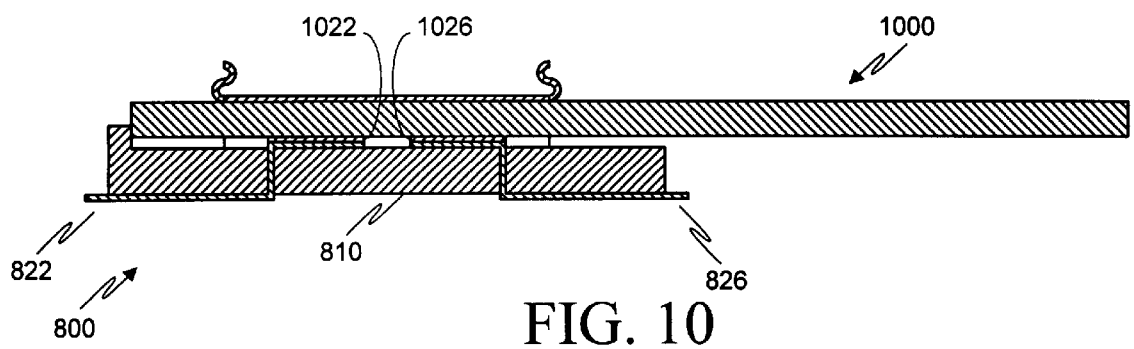
FIG. 10 is a cross-sectional view of a digital media device inserted into the socket of FIG. 8.

A socket 800 for receiving a digital media device 1000, which is representative of a device in the device family 300, is shown in FIGS. 8, 9 and 10. The socket base 810 is made of any suitable electrically insulative, durable and heat-resistant material, such material being well known in the art. Eight electrical contact pads 821, 822, 823, 824, 825, 826, 827 and 828 of any suitable material are molded into and held in place by the base 810, such material being well known in the art. Alternatively, in single-chip cards and for the NXS protocol described below, six contact pads are sufficient for the digital media device so that contact pads 824 and 828 of the socket 800 may be eliminated if desired. An end of each of the pads 821–828 is brought out beyond the base 810 for connection to external circuitry. As more clearly visible in the cross-section of FIG. 9, the other end of each of the pads 821–828 is bent up from the base 810 and has a springy characteristic to press against and engage a contact pad on the digital media device 1000. A U-shaped envelope 830 is attached to the base 810 during the molding process, and rises therefrom over the bent ends of the pads 821–828 to provide a cavity for receiving the digital media device 1000.

FIG. 10 shows the digital media device 1000 (die and interconnections are omitted for clarity) inserted into the socket 800. The bent ends of the pads 821–828, e.g. pads 822 and 826 are shown, are stressed by the inserted digital media device 1000 and push it against the envelope 830, thereby holding it firmly in place and contacting pads on the digital media device 1000, e.g. pads 1022 and 1026. Weak interlocks (not shown) of any suitable type well known in the art may be provided on the socket 800 and on the digital media device 1000 if desired to provide a discernible tactile response when the digital media device 1000 is properly seated.

The socket shown in FIG. 8, FIG. 9 and FIG. 10 is illustrative, and suitable sockets for receiving the digital media device 1000 are readily available. For example, standard sockets conforming to the eight pin ISO IC card standard are suitable if modified to guide the relatively narrower digital media device 1000 into engagement with the electrical contacts of the socket. The ISO IC sockets are available from various manufacturers, including ITT Cannon Corporation of Santa Ana, Calif.; see CCM Smart Card Connectors Catalog, Document No. CCM 7/94-A, July 1994. A suitable socket from this manufacturer is part number CCC 03 3504. The six pad SIM sockets are also suitable for receiving the digital media device 1000 where only six contact pads are active. SIM socket types having pivot covers can also be used provided they are modified by removal of a siderail to permit side insertion. Six pad SIM sockets and custom eight pad SIM sockets are available from various manufacturers, including Amphenol of Hamden, Conn.

Preferably, the digital media devices of the family 300 incorporate high density serial flash memory, which requires few power and signal lines and permits low voltage operation, low power consumption, and high capacity nonvolatile data storage. A suitable serial flash memory circuit is disclosed in U.S. Pat. No. 5,291,584, issued Mar. 1, 1994 to Challa et al. and entitled "Method and Apparatus for Hard Disk Emulation," which is hereby incorporated herein by reference in its entirety. One type of serial flash memory includes one or more flash memory arrays, one or more row decoders, column selects, page latches, data shift registers, sense amps, row address shift registers, and control logic and data buffers.

Other serial standards and specifications may also be suitable other than the specification set forth in the aforementioned Challa et al. patent, including, for example, SPI, I2C, COPS and MICROWIRE. However, serial flash memory of the type disclosed in the aforementioned Challa et al. patent is particularly advantageous because it requires a minimum number of electrical contacts, is capable of being manufactured at high memory densities, is of relatively small die size, and has low power consumption. For example, the Challa bit-serial flash memory requires only four outside connections, viz. $V_{CC}$, ground, data input/output ("I/O"), and clock. Other connections may be desirable in some applications or for other types of flash memory, including, for example, chip select, write protect, ready/busy, and memory test. Typical densities available with current process technology are in the range of 1 Megabit to 16 Megabits, and densities are expected to increase with improvements in process technology. A memory density of, for example, 8 Megabits fabricated with conventional 0.7 $\mu$m process technology typically is presently available.

The contact pads of the digital media devices in the family 300 are assigned signal and power functions depending on the interface selected. Preferred serial interface protocols are the Nexcom Serial Interface protocol, or NXS protocol, which is described in the aforementioned Challa et al. patent and specifies a two-wire interface, viz. Clock and Data I/O; and the Serial Peripheral Interface ("SPI") protocol, which specifies a four-wire interface, viz. Clock, Data In, Data Out, and Chip Select. The NXS and SPI protocols are illustrative, and other protocols may be used if desired. While the use of eight contact pads is described, six pads would be entirely satisfactory for some applications and the interface protocols would be adjusted accordingly.

One set of illustrative pad assignments for the digital media device 700 using the NXS protocol (pad assignments for the digital media devices 500 and 600 are analogous) are as follows: $V_{CC}$ at pad 711, NC (no connection) at pad 712, SCK at pad 713, NC at pad 714, GND and DT (card detect) at pad 715 (the digital media device 500 does not support DT), NC/WP\ and DT\ at pad 716, DIO at pad 717, and NC at pad 718.

Figure 11:
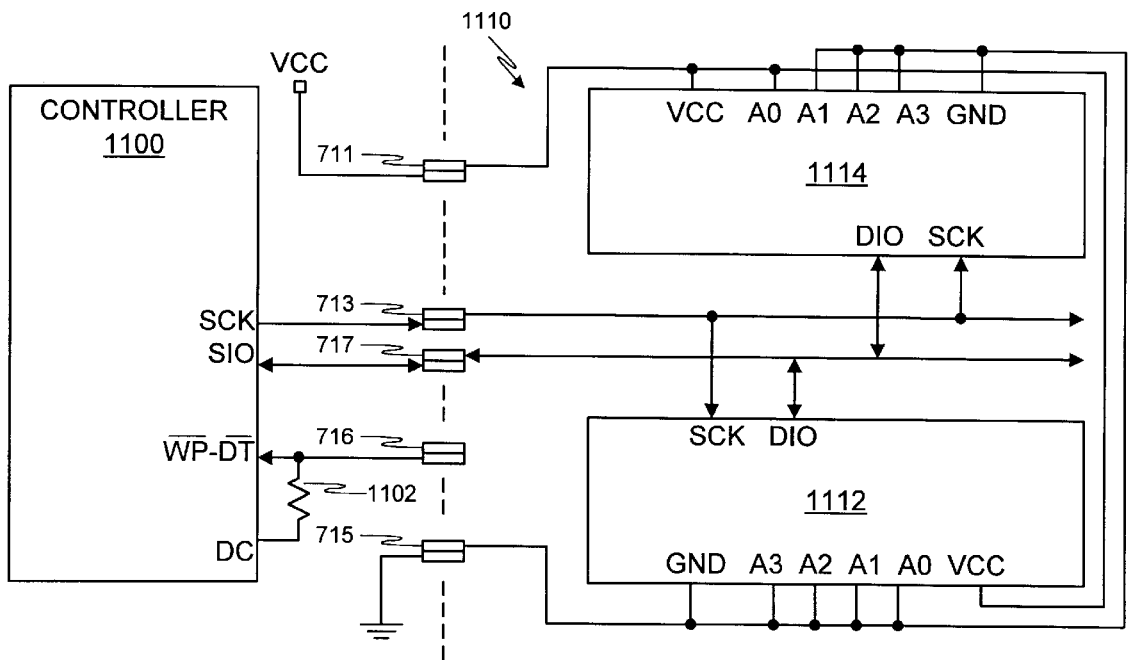
FIGS. 11, 12, 13 and 14 are block schematic diagrams of signal and power connections for exemplary interfaces for the digital media devices of the FIG. 3 family.

FIG. 11 is a block schematic diagram of illustrative electrical connections suitable for this set of illustrative pad assignments. $V_{CC}$ and ground are furnished to an NXS protocol digital media device 1110, which includes, illustratively, the contact pad array 710 (contact pad arrays 510 and 610 are analogous) through respective contact pads 711 and 715. The digital media device 1110 includes two NXS protocol memory integrated circuits 1112 and 1114 (alternatively, the digital media device 1110 may contain one memory integrated circuit or more than two memory integrated circuits). A controller 1100, which is any suitable controller, including, for example, general purpose microcontrollers, digital signal processors, and application-specific integrated circuit logic, furnishes its clock signal SCK to the SCK ports of the NXS protocol memory integrated circuits 1112 and 1114 through the contact pad 713, and its data signal SIO to the DIO ports of the NXS protocol memory integrated circuits 1112 and 1114 through the contact pad 717. As further described in the aforementioned Challa et al. patent, the NXS protocol supports multiple memory integrated circuits by having each memory integrated circuit receive chip select address information through the serial terminal, decode the chip select address information using on-board logic, and self-activate when the decoded address matches the IC's static address. The static addresses of the integrated circuits 1112 and 1114 are established by connecting the A0, A1, A2 and A3 terminals to $V_{CC}$ and ground, as appropriate. Resistor 1102 is a pull-up resistor having a value of, for example, 10,000 ohms, and is useful in card insertion/removal detection. The resistor 1102 is connected between a detect control port DC and a write protect-card detect port WP\-DT\ of the controller 1100. The write protect-card detect port WP\-DT\ of the controller 1100 contacts pad 716 when the digital media card is inserted into it's socket.

Another set of illustrative pad assignments for the digital media device 700 using the NXS protocol (pad assignments for the digital media devices 500 and 600 are analogous) are as follows: $V_{CC}$ at pad 711, A3-1 at pad 712, SCK at pad 713, A3-0 at pad 714, GND and DT (card detect) at pad 715 (the digital media device 500 does not support DT), WP\-DT\ and A2 at pad 716, SIO at pad 717, and A1 at pad 718.

Figure 12:
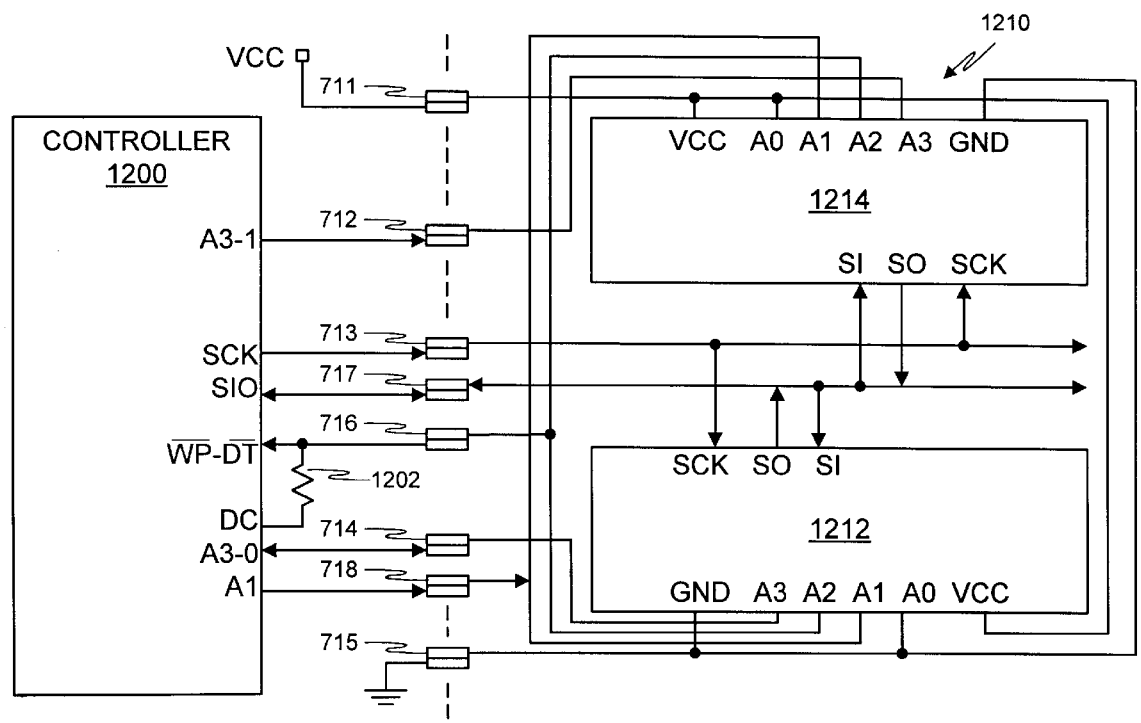

FIG. 12 is a block schematic diagram of illustrative electrical connections suitable for this set of illustrative pad assignments. $V_{CC}$ and ground are furnished to an NXS protocol digital media device 1210, which includes, illustratively, the contact pad array 710 (contact pad arrays 510 and 610 are analogous) through respective contact pads 711 and 715. The digital media device 1210 includes two NXS protocol memory integrated circuits 1212 and 1214 (alternatively, the digital media device 1210 may contain one memory integrated circuit or more than two memory integrated circuits). A controller 1200, which is any suitable controller, including, for example, general purpose microcontrollers, digital signal processors, and application-specific integrated circuit logic, furnishes its clock signal SCK to the SCK ports of the NXS protocol memory integrated circuits 1212 and 1214 through the contact pad 713, and its data signal SIO to the SI and SO ports of the NXS protocol memory integrated circuits 1212 and 1214 through the contact pad 717. As further described in the aforementioned Challa et al. patent, the NXS protocol supports multiple memory integrated circuits by having each memory integrated circuit receive chip select address information through the serial terminal, decode the chip select address information using on-board logic, and self-activate when the decoded address matches the IC's static address. The static addresses of the integrated circuits 1212 and 1214 are established by connecting the A0 terminals to $V_{CC}$ and ground, as appropriate. The A1 and A3-0 and A3-1 terminals are brought out for test purposes, or optionally may be tied high or low. The A2 terminal it tied high through resistor 1202, which is a pull-up resistor having a value of, for example, 10,000 ohms, and is useful in card insertion/ removal detection. The resistor 1202 is connected between a detect control port DC and a write protect-card detect port WP\-DT\ of the controller 1200. The write protect-card detect port WP\-DT\ of the controller 1200 contacts pad 716 when the digital media card is inserted into it's socket.

One set of illustrative pad assignments for the digital media device 700 using the SPI interface 700 are as follows: $V_{CC}$ at pad 711, CS0\ at pad 712, SCK at pad 713, CS1\ at pad 714, GND and DT at pad 715 (the digital media device 500 does not support DT), WP\ and DT\ at pad 716, SIO at pad 717, and RB (Ready/Busy) at pad 718.

Figure 13:
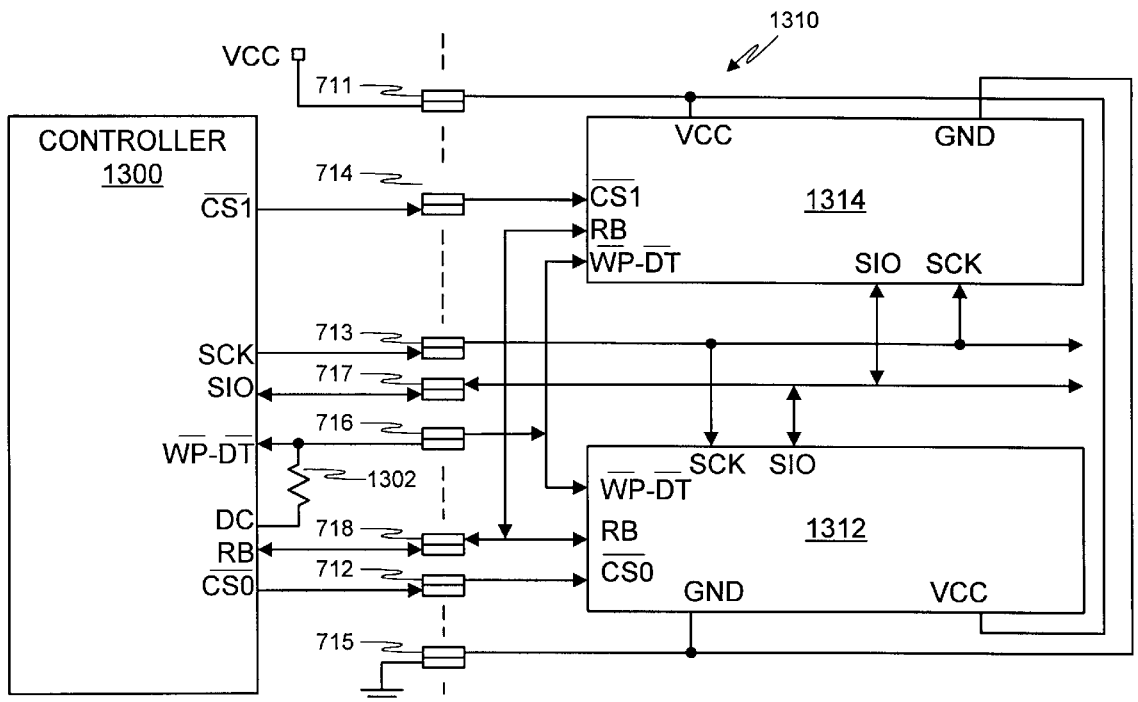

FIG. 13 is a block schematic diagram of illustrative electrical connections suitable for this set of illustrative pad assignments. $V_{CC}$ and ground are furnished to an SPI protocol digital media device 1310, which includes, illustratively, the contact pad array 710 (contact pad arrays 510 and 610 are analogous) through respective contact pads 711 and 715. The digital media device 1110 includes two SPI protocol memory integrated circuits 1312 and 1314 (alternatively, the digital media device 1310 may contain one memory integrated circuit or more than two memory integrated circuits). A controller 1300, which is any suitable controller, furnishes its clock signal SCK to the SCK ports of the SPI protocol memory integrated circuits 1312 and 1314 through the contact pad 713, and its data signal SIO to the SIO port of the SPI protocol memory integrated circuits 1312 and 1314 through the contact pad 717. The SPI protocol supports multiple memory integrated circuits by having each memory integrated circuit activated by a specific chip select signal. Hence, memory integrated circuit 1312 is selected by signal CS0\ applied through pad 712, and memory integrated circuit 1314 is selected by signal CS1\ applied through pad 714. Resistor 1302 is a pull-up resistor having a value of, for example, 10,000 ohms, and is useful in card insertion/removal detection. The resistor 1302 is connected between a detect control port DC and a write protect-card detect port WP\-DT\ of the controller 1300. The write protect-card detect port WP\-DT\ of the controller 1300 contacts pad 716 when the digital media card is inserted into it's socket. A ready-busy port RB of the controller 1300 is connected to corresponding ports of the memory integrated circuits 1312 and 1314 through pad 718.

Another set of illustrative pad assignments for the digital media device 700 using the SPI interface 700 are as follows: $V_{CC}$ at pad 711, CS1\ at pad 712, SCK at pad 713, CS0\ at pad 714, GND and DT at pad 715 (the digital media device 500 does not support DT), WP\ and DT\ at pad 716, SO at pad 717, and SI at pad 718.

Figure 14:
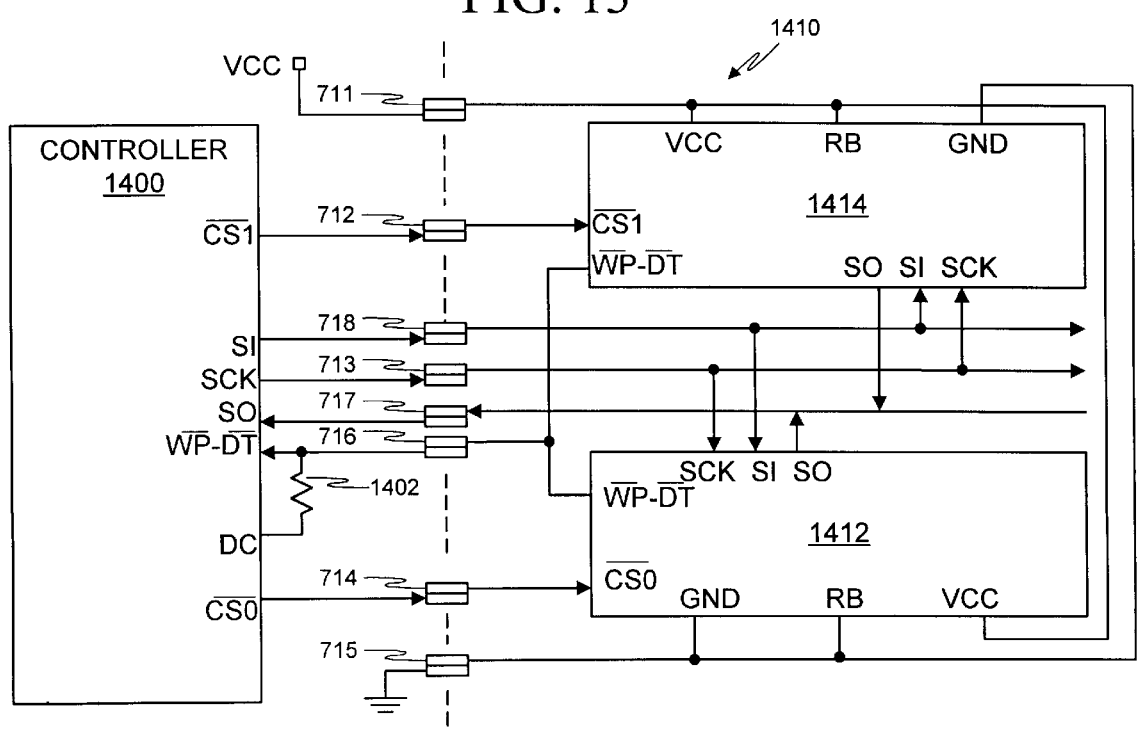

FIG. 14 is a block schematic diagram of illustrative electrical connections suitable for this set of illustrative pad assignments. $V_{CC}$ and ground are furnished to an SPI protocol digital media device 1410, which includes, illustratively, the contact pad array 710 (contact pad arrays 510 and 610 are analogous) through respective contact pads 711 and 715. The digital media device 1410 includes two SPI protocol memory integrated circuits 1412 and 1414 (alternatively, the digital media device 1410 may contain one memory integrated circuit or more than two memory integrated circuits). A controller 1400, which is any suitable controller, furnishes its clock signal SCK to the SCK ports of the SPI protocol memory integrated circuits 1412 and 1414 through the contact pad 713, and its data signals SO and SI to the SO and SI ports of the SPI protocol memory integrated circuits 1412 and 1414 through the contact pads 717 and 718, respectively. The SPI protocol supports multiple memory integrated circuits by having each memory integrated circuit activated by a specific chip select signal. Hence, memory integrated circuit 1412 is selected by signal CS0\ applied through pad 714, and memory integrated circuit 1414 is selected by signal CS1\ applied through pad 712. Resistor 1402 is a pull-up resistor having a value of, for example, 10,000 ohms, and is useful in card insertion/removal detection. The resistor 1402 is connected between a detect control port DC and a write protect-card detect port WP\-DT\ of the controller 1400. The write protect-card detect port WP\-DT\ of the controller 1400 contacts pad 716 when the digital media card is inserted into it's socket. Ready-busy ports of the memory integrated circuits 1412 and 1414 are not used, and are factory programmed as no-connect. However, they are tied to GND and VCC respectively.

Optional write protection is achieved using the GND-DT and WP\-DT\ ports. While the following functional description pertains to the NXS controller 1100 and digital media device 700, the NXS controller 1200, the SPI controllers 1300 and 1400, and digital media devices 500 and 600 function in an analogous manner. When write protection is desired, pad 726, which is electrically identical to pad 716, is shorted to pad 725, which is electrically identical to pad 715, using, for example, conductive tape, a conductive edge clip, or an integrated mechanical switch. When the digital media card 700 is inserted into a socket, the WP-DT port of the controller is pulled down, which is sensed as write protect by the controller 1110.

Other write protection techniques may be used if desired, including the provision of notches in the body of the digital media device which can be closed using either tape or a slideable tab to indicate write protect or write enable, as desired. Such techniques are well known in the art.

The digital media device 700 supports a card detection function with its unique arrangement of pads in the pad array 710. While the following functional description pertains to the NXS controller 1100, the NXS controller 1200 and the SPI controllers 1300 and 1400 controller 1200 function in an analogous manner unless otherwise mentioned. The detect control or DC port of the controller 1100 goes high at particular times to interrogate the socket. Illustratively, the DC port is periodically brought high for a brief period. If the card detect port or DT port of the controller 1100 is pulled up, it is an indication that no card is present in the socket or that a properly inserted card is present in the socket and is not write protected. A read is then attempted by sending a read opcode and static address on the port SIO for NXS protocol devices or by sending a chip select signal on CS0\ or CS1\ as appropriate and a read opcode on the port SIO (port SI of the controller 1400) for SPI protocol devices, and clocking port SCK. If the read is successful, a digital media device is properly installed and a transaction begins. If the read is not successful, no card is present. However, if the DT\ port is not pulled up, it is an indication that a card is present in the socket but is not properly inserted or that a properly inserted card is present in the socket and is write protected. A read is then attempted. If the read is successful, a write-protected digital media device is properly installed and a transaction begins. If the read is unsuccessful, an improperly inserted card is present and the controller 1100 signals an insertion error.

The digital media device 700 supports a card removal detection function with its unique arrangement of pads in the pad array 710. While the following functional description pertains to the NXS controller 1100, the NXS controller 1200 and the SPI controllers 1300 and 1400 function in an analogous manner. As the digital media device 700 is removed from its socket, pad 716 breaks contact with the WP\-DT\ port and the resistor 1102 pulls up the WP\-DT\ port for a relatively large number of clock cycles. This event is detected by the microcontroller 1100. Next the ground pad 715 makes contact with the WP\-DT\ port and pulls it down for a relatively large number of clock cycles, an event which is also sensed by the microcontroller 1100. The sequence of a prolonged high and low drive of the WP\-DT\ port is interpreted by the microcontroller 1100 as a card removal operation, and the microcontroller 1100 then begins the process of powering down the interface circuits. During the power down operation, pads 717 and 718 break contact with their respective ports, which are protected since they contact only the non-conductive material of the body of the digital media device 700. Power-down is completed before any pads of the digital media device can come into improper contact with pads of the socket, thereby prevent damage to any circuits of the host or the digital media device.

It will be appreciated that pad 716 performs two functions, the write protect function and the card detect function, thereby eliminating the need for another contact pad.

Figure 16:
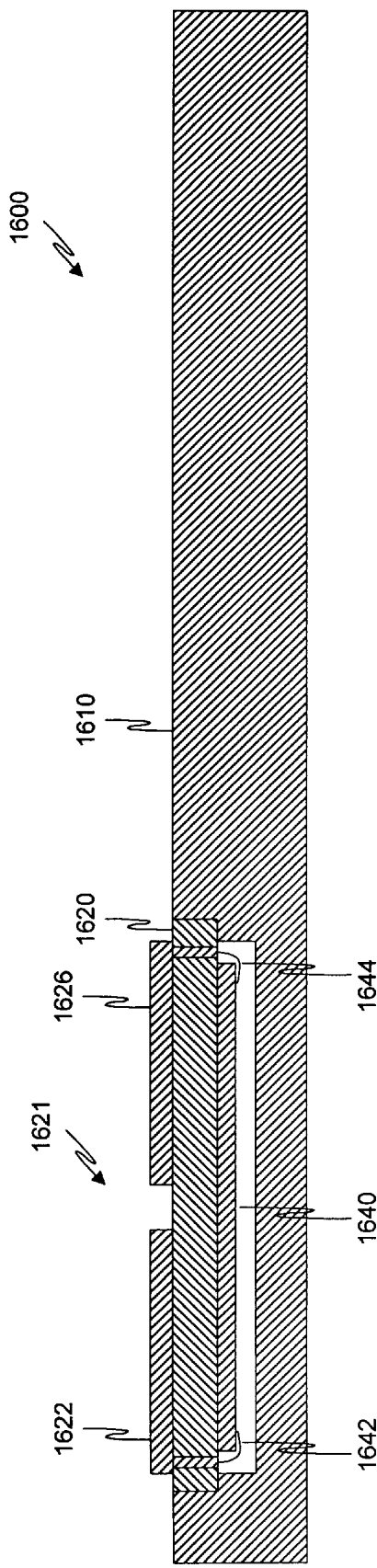
FIG. 16 is a cross-sectional view of a chip-on-board-modular digital media device having one chip.
Figure 17:
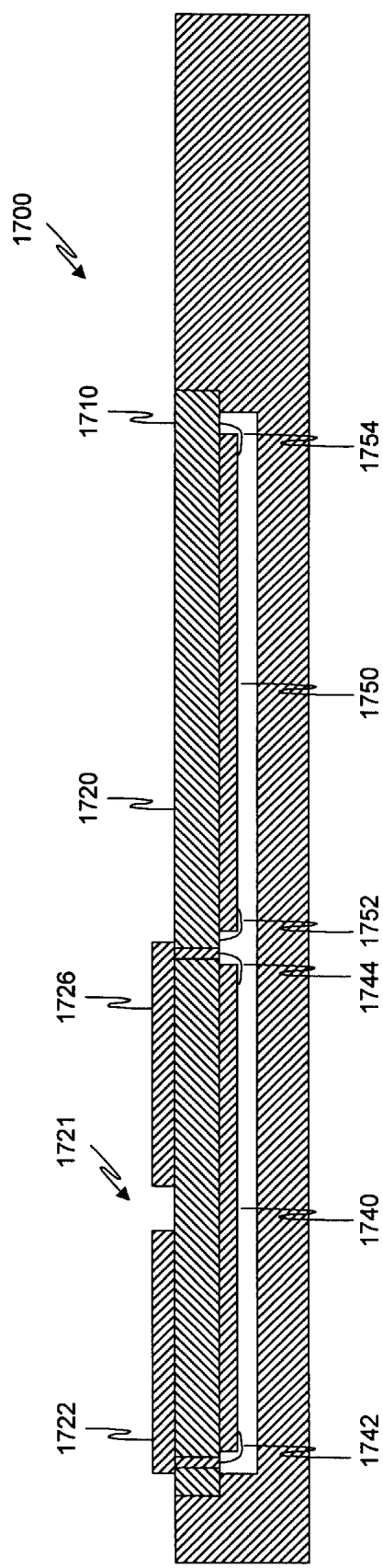
FIG. 17 is a cross-sectional view of a chip-on-board-modular digital media device having two chips.

Preferably, the digital media devices of the family 300 are fabricated using surface mount techniques or "Chip on Board" ("COB") techniques. Digital media devices 310 and 320 of FIG. 3 and the digital media device 1500 of FIG. 15 are illustrative of surface mount techniques. COB techniques include a chip-on-board modular technique, of which the digital media devices 330, 340 and 350 of FIG. 3 and the digital media devices 1600 and 1700 of FIGS. 16 and 17 are illustrative, and a chip-on-board direct technique, of which the digital media device 360 of FIG. 3 and the digital media device 1800 of FIG. 18 are illustrative. The COB techniques are advantageous in that they are particularly inexpensive.

FIG. 15 shows in cross-section a digital media device 1500 having two packaged memory integrated circuits mounted using surface mount techniques. It will be appreciated that only a single packaged integrated circuit may be used if desired, or more than two packaged integrated circuits may be used if space permits. A contact pad array 1520, represented by contact pads 1522 and 1526, is fabricated on the body 1510 using well known printed circuit board techniques. The body 1510 is made of any suitable preferably insulate material such as plastic, fiberglass, ceramic, PVC, PVCA, FR4, or any suitable rigid or semi-rigid, non-conductive, and durable material. Packaged integrated circuits 1540 and 1550, which may be packaged in any convenient manner although low profile plastic dual flat pack packaging is preferred, are mounted on opposite sides of the body 1510. Alternatively, packaged integrated circuits 1540 and 1550 may be mounted on the same side of the body 1510 if space allows. A suitable interconnect network is laid out between the packaged integrated circuits 1540 and 1550 and the contact pad array 1520 using well known printed circuit board techniques. A suitable encasing material 1530 is placed about the packaged integrated circuits 1540 and 1550 to provide protection and a gripping surface for manual handling of the digital media device 1500. The encasing material may encase the entire end of the digital media device, as shown by the digital media device 310 (FIG. 3), or may be localized about the packaged integrated circuit chips as shown in FIG. 15 and by the digital media device 320 (FIG. 3) so as to leave the long edges of the digital media device uncovered so that the digital media device 320 may be inserted fully into a slot via edge guides (not shown).

FIG. 16 shows in cross-section a digital media device 1600 having one die mounted using a COB modular technique. A cavity is milled in the body 1610 for receiving an memory integrated circuit die 1640. Alternatively, the body 1610 may be made of laminated sheets, with the cavity being obtained by stamping out portions of some of the sheets. The die 1640 is attached to a substrate 1620, which is made of any suitable preferably insulative material such as plastic, fiberglass, ceramic, PVC, PVCA, FR4, or any suitable rigid or semi-rigid, non-conductive, and durable material. Alternatively, a conductive material may be used provided insulative structures are provided where necessary for proper electrical operation. Wire bonds such as 1642 and 1644 electrically connect bonding pads on the die 1640 to conductive material that fills vias underlying the contact pads of the contact pad array 1621; contact pads 1622 and 1626 are illustrative. Suitable electrically conductive material for the vias and techniques for filling the vias are well known in the art. A mass of epoxy, plastic or other suitable encapsulation material (not shown) is placed over the die 1640 and the wire bonds, e.g. wire bonds 1642 and 1644, to protect these elements. The body 1610 is made of similar material as the substrate 1620. Alternatively, a more flexible material or a thinner sheet of rigid or semi-rigid material may be used for the body 1610 if desired, provided the substrate 1620, the encapsulation material (not shown), or both provide sufficient rigidity so that the die 1640 and the wire bonds, e.g. wire bonds 1642 and 1644, do not fail due to mechanical stress during normal use.

FIG. 17 shows in cross-section a digital media device 1700 having two memory integrated circuit die 1740 and 1750 mounted using COB techniques. Although dimensionally different, the elements of the digital media device 1700 are similar to the elements of the digital media device 1600. The die 1750 is electrically connected to the contact pads of the contact pad array 1721 (contact pads 1722 and 1726 are illustrative) by a suitable interconnect network laid out on the substrate 1720 between the integrated circuits 1740 and 1750 and the contact pad array 1721 using well known printed circuit board techniques.

FIG. 18 shows in cross-section a digital media device 1800 having two die mounted using a COB direct technique. The COB direct technique is similar to the COB modular technique, but the chips 1840 and 1850 are mounted on the surface of the body 1810 rather than mounted on a PCB which is then inserted into a cavity of the body. The chips 1840 and 1850 are electrically connected to an interconnect pattern (not shown) on the body 1810 of the digital media device 1800 using any suitable technique such as wire bonding, and the chips 1840 and 1850 are encapsulated in any suitable protective material 1830 such as epoxy. Advantageously, the COB technique results in nearly planar major surfaces due to the thinness of the chips 1840 and 1850; compare the digital media devices 300 of FIG. 3 and 1500 of FIG. 15 with the digital media devices 360 of FIG. 3 and 1800 of FIG. 18.

A digital media device incorporates multiple chips or integrated circuits ("IC") to achieve greater memory capacity. When two or more chips or integrated circuits compliant with the NXS protocol as described in the aforementioned Challa et al. patent are used, they preferably share common power, ground clock, and data I/O buses. Static address terminals on the chips or integrated circuits are tied to or supplied with $V_{CC}$ or ground as appropriate to impart an address to them so that one of them can be selected in accordance with an address furnished over the data I/O bus. In contrast, the SPI protocol uses separate chip select ports.

The digital media devices of the family 300 have numerous applications due to their various advantageous properties, which include the ability to be inserted and removed frequently, easily, and in a fool-proof manner, a small and convenient size and form factor, a high memory capacity, non-volatile storage, low power consumption, low voltage operation, and general durability. For example, the digital media devices of the family 300 is useful in communications, consumer, office, desktop publishing, portable computing, and industrial applications.

Figure 19:
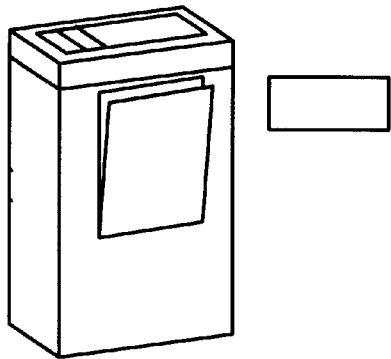
FIGS. 19–23 are pictorial views of various applications for the digital media devices in the FIG. 3 family.
Figure 20:
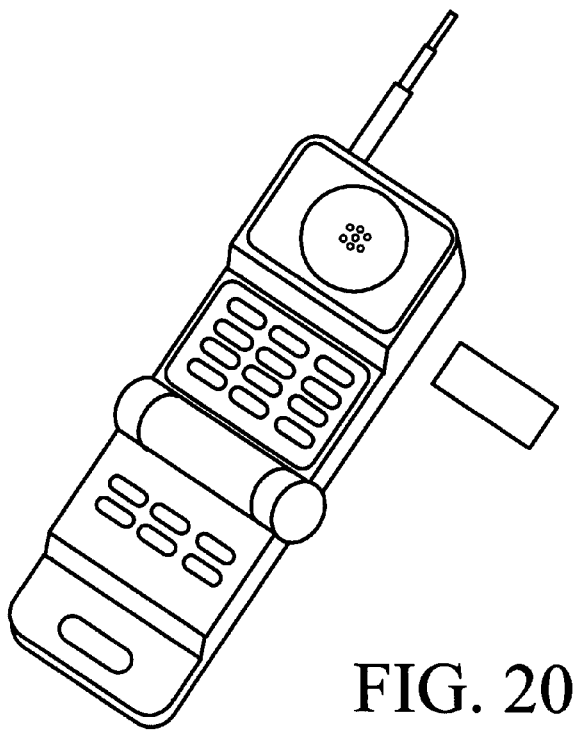

In communications, the digital media devices of the family 300 are useful with personal alpha-numeric pagers, two-way pagers, and voice pagers (FIG. 19) for providing enhanced storage capacity. The digital media devices of the family 300 are useful with two way radios, cellular telephones (FIG. 20), and land line telephones for maintaining user-specific information such as large telephone directories, telephone logs, outgoing and incoming voice messages for personal answering machines, and outgoing and incoming data storage for facsimile, electronic mail, and transferred files. The digital media devices of the family 300 are useful with modems for storing all of the various forms of data within the capability of the modem. For example, a fax/data/phonemail modem furnished with the capability to receive and store e-mail, transferred files, facsimile messages, and digitized voice data stores this data on the digital media device, which is then removed from the modem and plugged into a personal computer or personal data assistant for retrieval or play-back. Conversely, data is downloaded from the personal computer or personal data assistant to the digital media device, which is then removed from the personal computer or personal data assistant and plugged into a modem for transmission.

Figure 21:
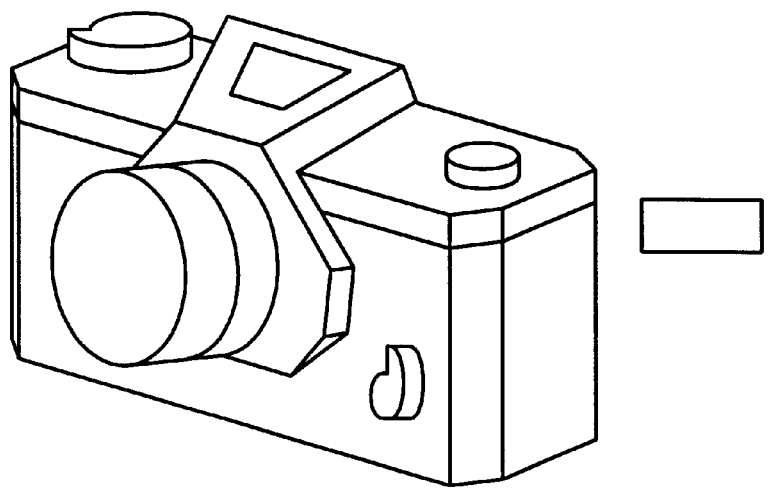

In consumer applications, office applications, and desktop publishing, the digital media devices of the family 300 are useful with digital cameras (FIG. 21) for storing pictures and voice recording (e.g. annotations), which are retrievable immediately or later by the camera or a personal computer or other digital media access device, or which may be transferred by modem or digitally to such devices. In addition, the digital media devices of the family 300 are useful with image scanners, digital voice recorders, pen-based tablets, and video capture devices.

Figure 22:
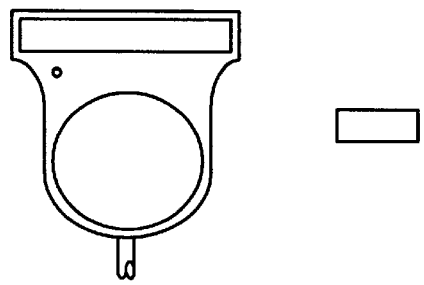
Figure 23:
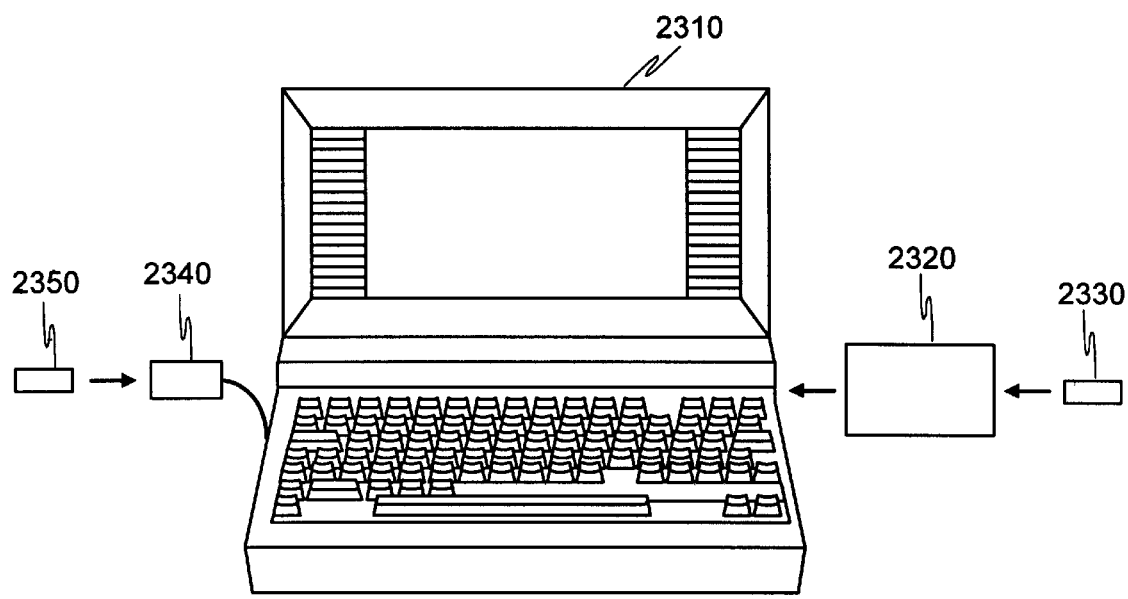

In portable computing, the digital media devices of the family 300 are useful with image scanners, and especially handheld image scanners (FIG. 22), for acquiring digital images for later retrieval by a personal computer or other digital media access device, or which may be transferred by modem or digitally to such devices. The digital media devices of the family 300 are useful with computers, especially personal data assistants and laptop personal computers, and even personal data assistants and laptop computers having PC card slots and serial ports through the use of suitable adapters (FIG. 23), for providing significant additional data storage at a lower initial cost, since memory need be purchased only as required and remains useful even as more memory is acquired. Presently, sufficient data storage must be purchased to anticipate future needs, or replaced with higher capacity memory at a later date.

Digital media devices are also useful for temporary storage of downloadable code in a low cost computer system such as an internet terminal, where the downlodable code is selectively copied into RAM for execution.

The digital media devices of the family 300 are particularly useful in certain industrial applications such as environmental monitors, industrial process monitors, medical monitors, and computer controlled machinery. For example, when used as a removable storage media for computer controlled machinery, the digital media device stores controlling and profiling data downloaded from a computer and provides access to this information when plugged into the computer-controlled machinery. When used as a removable storage media of a medical data recorder or monitor, the digital media device stores the medical history of a patient, the doctor's instructions to the medical staff, and medication requirements, including amounts, times, special administration procedures, EKG patterns, blood pressure, and other monitored data. In use, the medical digital media card preferably is attached to the patient's clip-board. During a visit, the doctor plugs the medical media device card into a voice recorder and dictates oral instructions, then returns the medical media device card to the patient's clip-board. To administer medication, the nurse plugs the medical media device card into a medication administration and monitoring machine, which plays back any special instructions given by the doctor and records the dose and time of medication, and returns the medical media device card to the patient's clip-board. Any special observations may be dictated for future play-back by the doctor. Other industrial applications include hand held terminals, electronic meters, portable bar code readers, global positioning terminals, talking sales displays, signal generators and analyzers, flight recorders, and environmental data loggers.

Advantageously, due to its removable nature, the digital media devices of the family 300 provide a common storage media among many different electronic products, as well as a linking media among these products. For example, the same digital media device is suitable for storing pictures taken with a digital camera, recording messages from a cellular phone, recording a shopping list from a voice recorder, store an e-mail message received with a modem, store text and graphics scanned from a book, and store stock quotes downloaded from a commercial service. All of this data is available to any electronic product capable of utilizing it. Moreover, the same digital media device also may store applications programs for using the data, so that the host device need not have the application program permanently installed to use the stored data.

To maintain low cost, preferable the logic for reading, programming, and controlling the memory on-board the digital media devices of the family 300 is implemented in the host or in an adapter, although some inexpensive additional functionality such as error correction may be provided on-board the digital media device itself if desired. Suitable logic for reading, programming, and controlling the memory on-board the digital media device is described in the aforementioned Challa patent. Examples of arrangements in which the logic is located in the host are the voice/data pager of FIG. 19, the cellular telephone of FIG. 20, the digital camera of FIG. 21, and the image scanner of FIG. 22. An example of an arrangement in which the logic is located in an adapter is the laptop computer and PCMCIA flash memory card of FIG. 23. The laptop computer 2310 is any laptop computer having a PCMCIA slot. The adapter 2320 is any ATA PC card containing suitable logic and a socket for receiving a digital media device 2330, and preferably an ATA PC card using the technology described in the aforementioned Challa et al. patent. Such cards are available in various memory capacities from Nexcom Technology, Inc. of Sunnyvale, Calif., under the trademark NexFLASH. Other examples of suitable adapters include serial and parallel port interface adapters and compact flash cards such as 110 containing a socket for receiving the digital media device. It will be appreciated that adapters may have two or more sockets to provide increased memory capacity.

Figure 24:
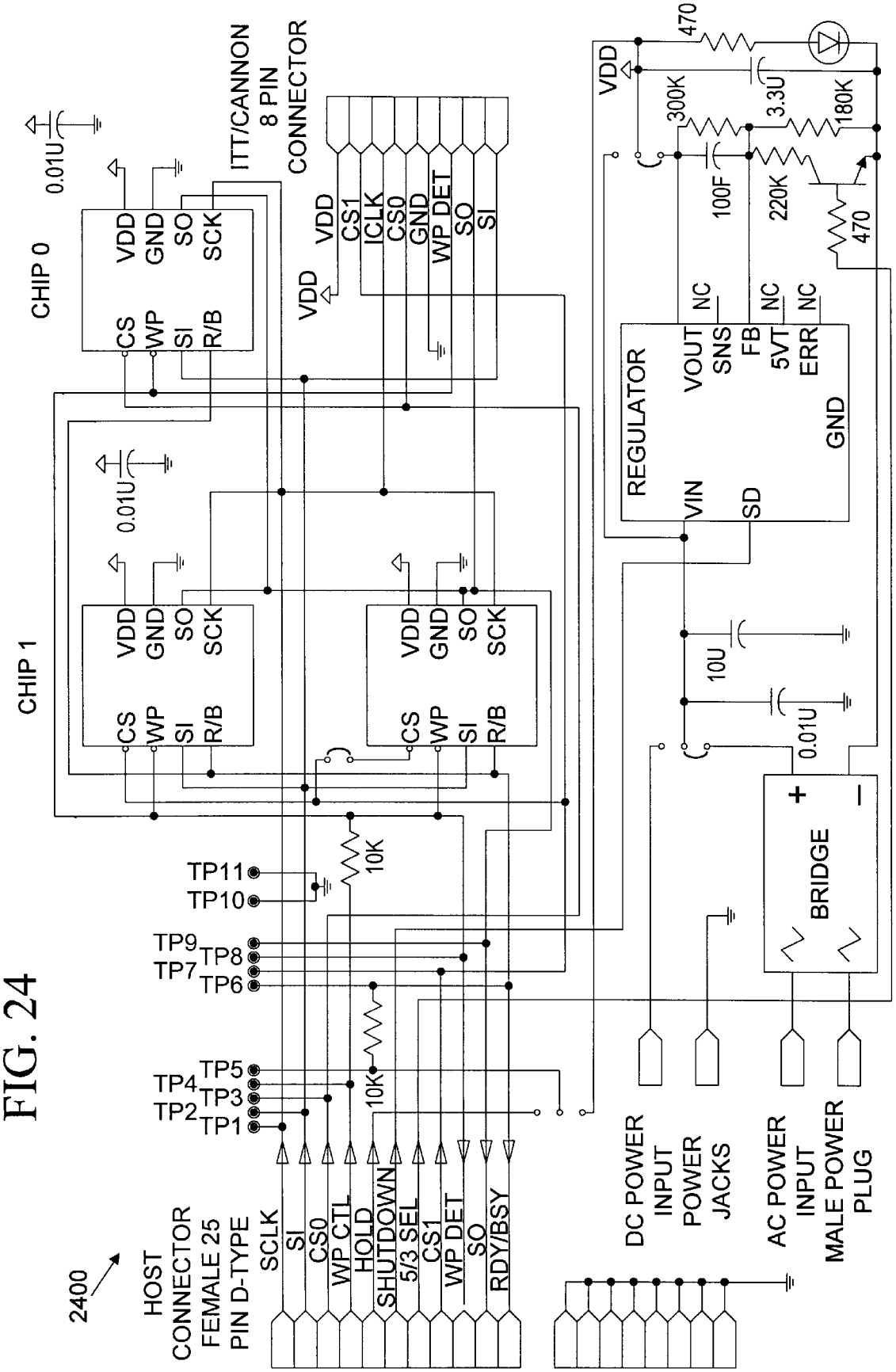
FIG. 24 is a schematic diagram of an adapter for interfacing a standard PC parallel port to a digital media device.

An adapter 2400 suitable for inexpensively interfacing a standard PC port such as a parallel port to a digital media device such as, for example, an SPI protocol device such as that shown in FIG. 14 is shown in the schematic diagram of FIG. 24. The adapter 2400 essentially maps the pins of the standard parallel port to the pads of either an NXS or SPI protocol digital media device, and contains no microcontroller and no or minimal logic. Instead, digital media device memory access functions such as DOS file system compatibility, buffering, multiple chip access, data validation, and API are implemented in software running on the host.

As shown in FIG. 24, pin 8 of P1 is assigned to signal 5/3_SEL, which provides dual voltage control (5.0 V and 3.3 V) via the bit 6 of the parallel port. Pin 7 of P1 is assigned to signal SHUTDOWN, which provides power control via the setting bit 5 on the parallel port. Pin 4 of P1 is assigned to signal CS0, which is a chip select signal common to both GSM or DIP flash memory package types at location device 0. Pin 9 of P1 is assigned to signal CS1, which is another chip select signal for GSM to accommodate a digital media device containing two integrated circuits. A jumper JP1 selects CS1 to TSOP or DIP flash memory package type at the location of device 1. A jumper JP2 selects either low voltage AC or low voltage DC input. A voltage regulator U5 is included. A jumper JP3 selects $V_{DD}$ from either UNREG, which is an external power source, or REG, which is an internal DC voltage regulator. Pin 10 of P1 is assigned to signal WP_DET for device detection.

The adapter 2400 includes various chip sockets U1, U2 and U3 for additional flexibility, and is particularly suitable for use as a development kit. However, the chip sockets U1, U2 and U3 may be omitted and the adapter 2400 packaged with or without the regulator U5 for consumer use, as shown by the adapter 2340 of FIG. 23, which is shown plugged into the parallel port of the laptop computer 2310 and receiving digital media device 2350. It will be appreciated that a "mapping" type adapter may also be packaged in a PC card shell that plugs into the PCMCIA port of the laptop 2310 and receives one or more digital media devices, provided appropriate software is installed on the laptop computer 2310 for controlling access to the digital media device(s).

The description of the invention set forth herein is illustrative, and is not to be taken as a limitation on the scope of the invention. Variations and modifications of the embodiments disclosed herein are possible. For example, although several examples of form factors and various dimensions are given, these examples and dimensions are illustrative. Moreover, specific embodiments contain eight and six pins, but fewer or more pins may be used if desired, as well as an odd number of pins. Moreover, some pins may be assigned different functions than specified by the NXS and SPI protocols, including test functions. These and other variations and modifications of the embodiments disclosed herein may be made without departing from the scope and spirit of the invention as set forth in the following claims.

What is claimed is:

1. A storage apparatus comprising:

a body having first and second opposing major surfaces;

an array of electrical contact pads integral with the body and disposed generally level with the first major surface, the electrical contact pad array including a data pad, a power pad, a ground pad, and a clock pad;

a serial data line integral with the body and coupled to the data pad;

a power line integral with the body and coupled to the power pad;

a ground line integral with the body and coupled to the ground pad;

a clock line integral with the body and coupled to the clock pad; and a high capacity memory integrated circuit integral with the body, the memory integrated circuit having a serial data port coupled to the serial line, a power node coupled to the power line, a ground node coupled to the ground line, and a clock node coupled to the clock line.

2. An apparatus as in claim 1 wherein:

the body is of an elongated shape having first and second ends; and the electrical contact pad array is proximate to the first end of the body.

3. An apparatus as in claim 1 wherein:

the body is of an elongated shape having first and second ends and a first substantially constant width portion proximate the first end; and the electrical contact pad array is proximate the first end of the body and extends substantially across the substantially constant width portion.

4. An apparatus as in claim 3 wherein the first substantially constant width portion comprises edges for engaging edge guides.

5. An apparatus as in claim 3 wherein the body further comprises a second substantially constant width portion extending from the first substantially constant width portion and equal in width thereto.

6. An apparatus as in claim 5 wherein the first and second substantially constant width portions comprises edges for engaging edge guides.

7. A storage apparatus comprising:

a generally rectangular elongated body having first and second substantially planar opposing major surfaces and first and second ends;

an array of electrical contact pads integral with the body and disposed generally in the plane of the first major surface and extending substantially across a portion of the first major surface proximate the first end, the electrical contact pad array including a data pad, a power pad, a ground pad, and a clock pad;

a serial data line integral with the body and coupled to the data pad;

a power line integral with the body and coupled to the power pad;

a ground line integral with the body and coupled to the ground pad;

a clock line integral with the body and coupled to the clock pad; and a high capacity memory integrated circuit integral with the body, the memory integrated circuit having a serial data port coupled to the serial line, a power node coupled to the power line, a ground node coupled to the ground line, and a clock node coupled to the clock line.

8. An apparatus as in claim 7 wherein the body comprises a main portion and a substrate portion, the memory integrated circuit being disposed on a first side of the substrate portion and in a cavity of the main body portion, and the electrical contact pad array being disposed on a second side of the substrate portion opposing the first side and substantially coplanar with the first major surface.

9. An apparatus as in claim 7 wherein the memory integrated circuit is disposed on the first major surface.

10. A digital media system comprising:
a digital media card comprising:
a thin, elongated, and generally rectangular body with first and second opposing ends and first and second generally planar opposing major surfaces, the body being of a predetermined width and length;
an array of electrical contact pads integral with the body and disposed generally in the plane of the first major surface and extending substantially across a portion of the first major surface proximate the first end, the electrical contact pad array including a data pad, a power pad, a ground pad, and a clock pad;
a serial data line integral with the body and coupled to the data pad;
a power line integral with the body and coupled to the power pad;
a ground line integral with the body and coupled to the ground pad;
a clock line integral with the body and coupled to the clock pad; and
a high capacity memory integrated circuit integral with the body, the memory integrated circuit having a serial data port coupled to the serial line, a power node coupled to the power line, a ground node coupled to the ground line, and a clock node coupled to the clock line; and
a socket comprising:
a cage having a depth, width and thickness for receiving the portion of the body over which the first array extends; and
a second array of electrical contact pads integral with the socket within the cage and disposed to mate with the first-mentioned contact array when the card is engaged by the cage.

11. An insertable and removable non-volatile digital data storage apparatus for use in electronic apparatus having digital data storage requirements, comprising:
a body generally of a form convenient for handling by a human hand and for insertion to and removal from the digital apparatus;
a high capacity digital memory including at least a first memory integrated circuit having a plurality of programmable memory cells and securely mounted with respect to the body, the memory having serial data transfer, clock, power, and ground connectivity requirements for programming and reading the programmable memory cells; and
a plurality of electrical contacts integral with the body and satisfying the serial data transfer, clock, power, and ground connectivity requirements of the memory.

12. An apparatus as in claim 11 further comprising:
a write-protect signal generator having a write-protect indication connectivity requirement; and
an additional electrical contact integral with the body and providing the write-protect indication connectivity requirement.

13. An apparatus as in claim 11 wherein the first memory integrated circuit has a first integrated circuit select connectivity requirement for selective access thereto, further comprising an additional electrical contact integral with the body and satisfying the first integrated circuit select connectivity requirement.

14. An apparatus as in claim 11 wherein:
the memory has at least a second memory integrated circuit securely mounted with respect to the body; and
the first and second memory integrated circuits have respective first and second integrated circuit select connectivity requirements for selective access thereto;
further comprising first and second additional electrical contact integral with the body and satisfying the first and second integrated circuit select connectivity requirements.

15. An apparatus as in claim 14 wherein the first and second memory integrated circuits have respective ready-busy connectivity requirements for controlling access thereto, further comprising a third additional electrical contact integral with the body and satisfying the ready-busy connectivity requirements.

16. An insertable and removable non-volatile digital data storage apparatus for use in electronic apparatus having digital data storage requirements, comprising:
a body generally of a form convenient for handling by a human hand and for insertion to and removal from the digital apparatus;
a high capacity digital memory integrated circuit having a plurality of programmable memory cells and securely mounted with respect to the body, the memory integrated circuit having serial data transfer, clock, power, and ground connectivity requirements for programming and reading the programmable memory cells; and
a plurality of electrical contacts integral with the body and satisfying the serial data transfer, clock, power, and ground connectivity requirements of the memory integrated circuit.

17. An apparatus as in claim 16 further comprising:
a write-protect signal generator having a write-protect indication connectivity requirement; and
an additional electrical contact integral with the body and providing the write-protect indication connectivity requirement.

18. An insertable and removable non-volatile digital data storage apparatus for use in electronic apparatus having digital data storage requirements, comprising:
a body generally of a form convenient for handling by a human hand and for insertion to and removal from the digital apparatus;
a first high capacity digital memory integrated circuit having a plurality of programmable memory cells and securely mounted with respect to the body, the memory integrated circuit having serial data transfer, clock, first select, power, and ground connectivity requirements for selectively programming and reading the programmable memory cells thereof;
a second high capacity digital memory integrated circuit having a plurality of programmable memory cells and securely mounted with respect to the body, the memory integrated circuit having serial data transfer, clock, second select, power, and ground connectivity requirements for selectively programming and reading the programmable memory cells thereof; and
a plurality of electrical contacts integral with the body and satisfying the serial data transfer, clock, first select, second select, power, and ground connectivity requirements of the first and second memory integrated circuits.

19. An apparatus as in claim 18 wherein the first and second select connectivity requirements are chip select inputs of the first and second memory integrated circuits.

20. An apparatus as in claim 18 further comprising:
a write-protect signal generator having a write-protect indication connectivity requirement; and
an additional electrical contact integral with the body and providing the write-protect indication connectivity requirement.

21. An insertable and removable digital data storage apparatus for use in electronic apparatus having digital data storage requirements, comprising:
a body generally of a form convenient for repeated insertion into the digital apparatus in a predetermined direction and removal therefrom by a human hand, the body having a first end extending in the predetermined direction;
a high capacity digital memory including a first memory integrated circuit securely mounted with respect to the body, the memory having serial data transfer, clock, power, and ground connectivity requirements for accessing the first memory integrated circuit, and an additional connectivity requirement for selecting the first memory integrated circuit during an access thereof; and
a plurality of electrical contacts integral with the body and satisfying the serial data transfer, clock, power, and ground connectivity requirements and the additional connectivity requirement of the memory, wherein at least one of the electrical contacts is spaced away from the first end.

22. An apparatus as in claim 21 further comprising:
a write-protect signal generator having a write-protect indication connectivity requirement; and
an additional electrical contact integral with the body and providing the write-protect indication connectivity requirement;
wherein the additional electrical contact and the contact satisfying the ground connectivity requirement comprise respective portions aligned generally in the direction of insertion.

23. An apparatus as in claim 22 wherein the contact satisfying the ground connectivity requirement comprises a first portion adjacent the additional electrical contact transverse to the direction of insertion and removal, and a second portion adjacent the additional electrical contact in the direction of insertion.

24. An apparatus as in claim 21 wherein the electrical contacts comprise a first electrical contact satisfying the serial data transfer connectivity requirement, a second electrical contact satisfying the clock connectivity requirement, a third electrical contact satisfying the power connectivity requirement, a fourth electrical contact satisfying the ground connectivity requirement, and a fifth electrical contact satisfying the additional connectivity requirement of the memory, the electrical contacts further being arranged in a first row proximate to the first end and a second row proximate to the first row.

25. An apparatus as in claim 24 wherein the first row comprises the second, third, and fifth contacts, and the second row comprises the first and fourth contacts.

26. An apparatus as in claim 24 wherein the first and second rows are parallel to the first end.

27. An apparatus as in claim 26 wherein:
the body comprises a generally planar major surface; and
the first, second, third, fourth, and fifth contacts comprise pads disposed generally level with the major surface.

28. An apparatus as in claim 21 wherein the memory further comprises a second memory integrated circuit securely mounted with respect to the body, the additional connectivity requirement further distinguishing between the first and second memory integrated circuits during a memory access.

29. An apparatus as in claim 28 wherein at least one of the first and second memory integrated circuits comprises non-volatile programmable memory cells.

30. An insertable and removable digital data storage apparatus for use in electronic apparatus having digital data storage requirements, comprising:
means for transferring data between the digital apparatus and the card through a first contact thereof;
means for applying a clock signal to the card through a second contact thereof;
means for applying power to the card through a third contact thereof;
means for applying ground to the card through a fourth contact thereof; and
means for determining a write-protect condition of the card through a fifth contact thereof.

31. A method for transferring data between a digital apparatus having data storage requirements and a high-capacity digital data storage card, comprising:
inserting the card into the digital apparatus, wherein a leading edge of the card passes through an external access orifice of the digital apparatus;
applying power to the card through a first contact thereof; and
applying ground to the card through a second contact thereof; and
applying a clock signal to the card through a third contact thereof; and
serially transferring a large digital file between the digital apparatus and the card through a fourth contact thereof;
wherein at least one of the first, second, third and fourth contacts is spaced away from the leading edge of the card.

32. A method for transferring data between a digital apparatus having data storage requirements and a high-capacity digital data storage card, comprising:
inserting the card into the digital apparatus, wherein a leading edge of the card passes through an external access orifice of the digital apparatus;
applying power to the card through a first contact thereof;
applying ground to the card through a second contact thereof;
applying a clock signal to the card through a third contact thereof;
serially transferring a large digital file between the digital apparatus and the card through a fourth contact thereof; and
determining a write-protect condition of the card through a fifth contact thereof;
wherein at least one of the first, second, third, fourth and fifth contacts is spaced away from the leading edge of the card.

33. A method for transferring data between a digital apparatus having data storage requirements and a high-capacity digital data storage card, comprising:
inserting the card into the digital apparatus, wherein a leading edge of the card passes through an external access orifice of the digital apparatus;
applying power to the card through a first contact thereof;
applying ground to the card through a second contact thereof;

applying a clock signal to the card through a third contact thereof;

serially transferring a large digital file between the digital apparatus and the card through a fourth contact thereof;

applying a first chip select signal to the card through a fifth contact thereof; and applying a second chip select signal to the card through a sixth contact thereof;

wherein at least one of the first, second, third, fourth, fifth and sixth contacts is spaced away from the leading edge of the card.

34. A method for transferring data between a digital apparatus having data storage requirements and a high-capacity digital data storage card, comprising:

inserting the card into the digital apparatus in a predetermined direction;

applying power to the card through a first contact thereof;

applying ground to the card through a second contact thereof;

applying a clock signal to the card through a third contact thereof; and serially transferring a large digital file between the digital apparatus and the card through a fourth contact thereof;

wherein the first, second, third and fourth contacts are disposed on the card in a plurality of rows.

35. A method as in claim 34 further comprising determining a write-protect condition of the card through a fifth contact thereof, wherein the contacts are further arranged in first and second rows generally normal to the direction of insertion, and in first, second, third and fourth columns generally parallel to the direction of insertion, the first contact being in row:column position 1:1, the second contact being in row:column position 2:1, the third contact being in row:column position 1:3, the fourth contact being in row::column position 2:3, and the fifth contact being in row:column position 2:2.

36. A method as in claim 34 further comprising:

determining a write-protect condition of the card through a fifth contact thereof;

applying a first chip select signal to the card through a sixth contact thereof; and applying a second chip select signal to the card through a seventh contact thereof;

wherein the contacts are further arranged in first and second rows generally normal to the direction of insertion, and in first, second, third and fourth columns generally parallel to the direction of insertion, the first contact being in row:column position 1:1, the second contact being in row:column position 2:1, the third contact being in row:column position 1:3, the fourth contact being in row:column position 2:3, the fifth contact being in row:column position 2:2, the sixth contact being in row:column position 1:2, and the seventh contact being in row:column position 1:4.

37. A method as in claim 34 wherein the data transferring step comprises transferring data from the card to the digital apparatus, further comprising:

determining a write-protect condition of the card through a fifth contact thereof;

applying a first chip select signal to the card through a sixth contact thereof;

applying a second chip select signal to the card through a seventh contact thereof; and transferring data from the digital apparatus to the card through an eighth contact thereof;

wherein the contacts are further arranged in first and second rows generally normal to the direction of insertion, and in first, second, third and fourth columns generally parallel to the direction of insertion, the first contact being in row:column position 1:1, the second contact being in row:column position 2:1, the third contact being in row:column position 1:3, the fourth contact being in row:column position 2:3, the fifth contact being in row:column position 2:2, the sixth contact being in row:column position 1:2, the seventh contact being in row:column position 1:4, and the eighth contact being in row:column position 2:4.

* * * * *